(12) United States Patent
Sakamoto et al.

(10) Patent No.: US 9,263,286 B2
(45) Date of Patent: Feb. 16, 2016

(54) DIARYLAMINE NOVOLAC RESIN

(71) Applicant: NISSAN CHEMICAL INDUSTRIES, LTD., Tokyo (JP)

(72) Inventors: Rikimaru Sakamoto, Toyama (JP); Yasunobu Someya, Toyama (JP); Keisuke Hashimoto, Toyama (JP); Hirokazu Nishimaki, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/348,461

(22) PCT Filed: Sep. 25, 2012

(86) PCT No.: PCT/JP2012/074551
§ 371 (c)(1),
(2) Date: Mar. 28, 2014

(87) PCT Pub. No.: WO2013/047516
PCT Pub. Date: Apr. 4, 2013

(65) Prior Publication Data
US 2014/0235059 A1     Aug. 21, 2014

(30) Foreign Application Priority Data
Sep. 29, 2011 (JP) .................. 2011-214555

(51) Int. Cl.
| | |
|---|---|
| *C08G 12/08* | (2006.01) |
| *H01L 21/308* | (2006.01) |
| *C08L 61/22* | (2006.01) |
| *G03F 7/09* | (2006.01) |
| *C09D 161/22* | (2006.01) |
| *C09D 179/02* | (2006.01) |
| *C09D 179/04* | (2006.01) |
| *C08G 73/02* | (2006.01) |
| *C08G 73/06* | (2006.01) |
| *C08L 79/02* | (2006.01) |
| *C08L 79/04* | (2006.01) |

(52) U.S. Cl.
CPC ............ *H01L 21/3081* (2013.01); *C08G 12/08* (2013.01); *C08G 73/026* (2013.01); *C08G73/0273* (2013.01); *C08G 73/0672* (2013.01); *C08L 61/22* (2013.01); *C08L 79/02* (2013.01); *C08L 79/04* (2013.01); *C09D 161/22* (2013.01); *C09D 179/02* (2013.01); *C09D 179/04* (2013.01); *G03F 7/091* (2013.01); *G03F 7/094* (2013.01)

(58) Field of Classification Search
CPC ......... C08G 12/08; C08L 61/22; G03F 7/091; G03F 7/094; G03F 7/2059; G03F 7/20; H01L 21/3081
See application file for complete search history.

(56) References Cited

U.S. PATENT DOCUMENTS

| | | | |
|---|---|---|---|
| 4,702,992 A | 10/1987 | Ishii et al. | |
| 7,378,217 B2 | 5/2008 | Oh et al. | |
| 2012/0077345 A1* | 3/2012 | Saito et al. | .................... 438/703 |

FOREIGN PATENT DOCUMENTS

| | | |
|---|---|---|
| JP | A-60-186532 | 9/1985 |
| JP | A-60-220931 | 11/1985 |
| JP | A-01-154050 | 6/1989 |
| JP | A-02-022657 | 1/1990 |
| JP | A-02-111948 | 4/1990 |
| JP | A-02-293850 | 12/1990 |
| JP | A-11-087065 | 3/1999 |
| JP | A-2005-128509 | 5/2005 |
| JP | A-2007-178974 | 7/2007 |
| JP | A-2007-199653 | 8/2007 |
| JP | A-2007-297540 | 11/2007 |
| WO | WO2010-147155 | * 12/2010 |
| WO | WO 2010/147155 A1 | 12/2010 |
| WO | WO 2011/065395 A1 | 6/2011 |

OTHER PUBLICATIONS

Written Opinion of International Searching Authority issued in PCT/JP2012/074551 mailed Jan. 15, 2013.

International Search Report issued in PCT/JP2012/074551 mailed Jan. 15, 2013.

\* cited by examiner

*Primary Examiner* — Brittany Raymond
(74) *Attorney, Agent, or Firm* — Oliff PLC

(57) ABSTRACT

A novel diarylamine novolac resin such as a phenylnaphthylamine novolac resin, and further a resist underlayer film-forming composition in which the resin is used in a lithography process for manufacturing a semiconductor device. A polymer including a unit structure (A) of Formula (1):

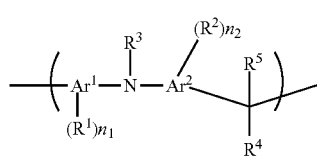

Formula (1)

(in Formula (1), each of $Ar^1$ and $Ar^2$ is a benzene ring or a naphthalene ring). A method for manufacturing a semiconductor device, including: forming an underlayer film on a semiconductor substrate with the resist underlayer film-forming composition; forming a hardmask on the underlayer film; forming a resist film on the hardmask; forming a resist pattern by irradiation with light or an electron beam followed by development; etching the hardmask with the resist pattern; etching the underlayer film with the hardmask thus patterned; and processing the semiconductor substrate with the underlayer film thus patterned.

13 Claims, 2 Drawing Sheets

DIARYLAMINE NOVOLAC RESIN

TECHNICAL FIELD

The present invention relates to a diarylamine novolac resin such as a phenylnaphthylamine novolac resin. The present invention further relates to a resist underlayer film-forming composition for lithography using a diarylamine novolac resin such as a phenylnaphthylamine novolac resin, which is useful for processing of a semiconductor substrate, a method for forming a resist pattern utilizing the resist underlayer film-forming composition, and a method for manufacturing a semiconductor device. The present invention also relates to a transparent film having a high refractive index within a visible range in which a phenylnaphthylamine novolac resin is used.

BACKGROUND ART

For manufacturing semiconductor devices, fine processing with lithography utilizing a photoresist composition has been conventionally used. The fine processing is a processing method including: forming a thin film of a photoresist composition on a substrate to be processed such as a silicon wafer; irradiating the substrate with active light such as ultraviolet through a mask pattern having a pattern of semiconductor device; performing development; and treating the substrate by etching with an obtained photoresist pattern as a protection film. In recent years, semiconductor devices tend to be more highly integrated, and a wavelength of active light used becomes shorter, such that from KrF excimer lasers (248 nm) to ArF excimer lasers (193 nm). Accordingly, the active light produces diffused reflections and standing waves from a substrate. To overcome such disadvantages, an anti-reflective coating (Bottom Anti-Reflective Coating, BARC) has been applied between photoresist and a substrate to be processed.

As resist patterns become finer in the future, resist films are required to be thinner to overcome resolution issues, or to avoid falling down of resist patterns after development. Thus, it is difficult for the resist pattern to have a film thickness sufficient to process the substrate. Accordingly, in addition to a resist pattern, a resist underlayer film formed between a resist and a semiconductor substrate to be processed is also required to serve as a mask when the substrate is processed. As a resist underlayer film to be used in such a process, there is required a resist underlayer film for lithography having a selection ratio for a dry etching rate close to that of the resist, having a selection ratio for a dry etching rate smaller than that of the resist, or having a selection ratio for a dry etching rate smaller than that of the semiconductor substrate, unlike conventional high etch rate resist underlayer films (having faster etching rates).

As a polymer for the resist underlayer film described above, the following are exemplified:

a resist underlayer film-forming composition using polyvinyl carbazole (see Patent Documents 1, 2, and 3);

a resist underlayer film-forming composition using a fluorene phenol novolac resin (see for example, Patent Document 4);

a resist underlayer film-forming composition using a fluorene naphthol novolac resin (see for example, Patent Document 5);

a resist underlayer film-forming composition including a resin having a repeating unit of fluorene phenol and aryl alkylene (see for example, Patent Documents 6 and 7); and a novolac resin using phenylnaphthylamine and acetaldehyde (see Patent Document 8).

PRIOR ART DOCUMENTS

Patent Documents

Patent Document 1: Japanese Patent Application Publication No. H2-293850 (JP 02-293850 A)

Patent Document 2: Japanese Patent Application Publication No. H1-154050 (JP 01-154050 A)

Patent Document 3: Japanese Patent Application Publication No. H2-22657 (JP 02-22657 A)

Patent Document 4: Japanese Patent Application Publication No. 2005-128509 (JP 2005-128509 A)

Patent Document 5: Japanese Patent Application Publication No. 2007-199653 (JP 2007-199653 A)

Patent Document 6: Japanese Patent Application Publication No. 2007-178974 (JP 2007-178974 A)

Patent Document 7: U.S. Pat. No. 7,378,217 (U.S. Pat. No. 7,378,217 B2)

Patent Document 8: Japanese Patent Application Publication No. 2007-297540 (JP 2007-297540 A)

SUMMARY OF THE INVENTION

Problem to be Solved by the Invention

The present invention provides a novel diarylamine novolac resin such as a phenylnaphthylamine novolac resin. The present invention further provides a resist underlayer film-forming composition using a diarylamine novolac resin such as a phenylnaphthylamine novolac resin, which is utilized in a lithography process for manufacturing a semiconductor device. The present invention also provides a resist underlayer film for lithography having a selection ratio for a dry etching rate close to that of the resist, having a selection ratio for a dry etching rate smaller than that of the resist, or having a selection ratio for a dry etching rate smaller than that of the semiconductor substrate, the resist underlayer film causing no intermixing with a resist layer and providing an excellent resist pattern. When irradiation light having a wavelength such as 248 nm, 193 nm, and 157 nm is used for fine processing, reflected light from a substrate can be efficiently absorbed with the present invention. Moreover, the present invention provides a method for forming a resist pattern using a resist underlayer film-forming composition, and provides a resist underlayer film-forming composition for forming a heat-resistant resist underlayer film.

By utilizing specific properties of a phenylnaphthylamine novolac resin, the present invention provides a transparent film having a high refractive index within a visible range and an electronic device utilizing the film.

Means for Solving the Problem

The present invention provides: as a first aspect, a polymer comprising: a unit structure (A) of Formula (1):

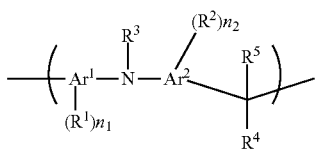

Formula (1)

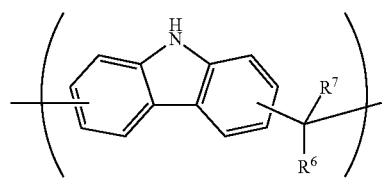

Formula (2)

(in Formula (1), each of $Ar^1$ and $Ar^2$ is a benzene ring or a naphthalene ring, each of $R^1$ and $R^2$ is a substituent of a hydrogen atom on the benzene ring or the naphthalene ring and is selected from the group consisting of a halogen group, a nitro group, an amino group, a hydroxy group, a $C_{1-10}$ alkyl group, a $C_{2-10}$ alkenyl group, a $C_{6-40}$ aryl group, and a combination of the halogen group, the nitro group, the amino group, the hydroxy group, the alkyl group, the alkenyl group, and the aryl group, in which each of the alkyl group, the alkenyl group, and the aryl group is an organic group that optionally contains an ether bond, a ketone bond, or an ester bond;

$R^3$ is selected from the group consisting of a hydrogen atom, a $C_{1-10}$ alkyl group, a $C_{2-10}$ alkenyl group, a $C_{6-40}$ aryl group, and a combination of the hydrogen atom, the alkyl group, the alkenyl group, and the aryl group, in which each of the alkyl group, the alkenyl group, and the aryl group is an organic group that optionally contains an ether bond, a ketone bond, or an ester bond;

$R^4$ is selected from the group consisting of a $C_{6-40}$ aryl group and a heterocyclic group, in which each of the aryl group and the heterocyclic group is an organic group that is optionally substituted with a halogen group, a nitro group, an amino group, a $C_{1-10}$ alkyl group, a $C_{1-10}$ alkoxy group, a $C_{6-40}$ aryl group, a formyl group, a carboxy group, or a hydroxy group;

$R^5$ is selected from the group consisting of a hydrogen atom, a $C_{1-10}$ alkyl group, a $C_{6-40}$ aryl group, and a heterocyclic group, in which each of the alkyl group, the aryl group, and the heterocyclic group is an organic group that is optionally substituted with a halogen group, a nitro group, an amino group, or a hydroxy group, $R^4$ and $R^5$ together with a carbon atom to which $R^4$ and $R^5$ are bound optionally form a ring, and each of $n_1$ and $n_2$ is independently an integer of 0 to 3);

as a second aspect, the polymer according to the first aspect, in which $R^5$ in Formula (1) is a hydrogen atom, and $R^4$ in Formula (1) is an optionally substituted phenyl group, an optionally substituted naphthyl group, an optionally substituted anthryl group, or an optionally substituted pyrenyl group;

as a third aspect, the polymer according to the first aspect or the second aspect, in which $R^3$ in Formula (1) is a hydrogen atom or a phenyl group;

as a fourth aspect, the polymer according to any one of the first to the third aspects, in which the unit structure (A) includes a unit structure (a1) where either $Ar^1$ or $Ar^2$ is a benzene ring, and the other is a naphthalene ring;

as a fifth aspect, the polymer according to any one of the first to the third aspects, in which the unit structure (A) includes a unit structure (a2) where both $Ar^1$ and $Ar^2$ are benzene rings;

as a sixth aspect, a polymer that is a copolymer, comprising: the unit structure (a1) as described in the fourth aspect and the unit structure (a2) as described in the fifth aspect;

as a seventh aspect, a polymer that is a copolymer, comprising: the unit structure (A) of Formula (1) as described in the first aspect and a unit structure (B) of Formula (2):

(in Formula (2), $R^6$ is selected from the group consisting of a $C_{6-40}$ aryl group and a heterocyclic group, in which each of the aryl group and the heterocyclic group is an organic group that is optionally substituted with a halogen group, a nitro group, an amino group, a $C_{1-10}$ alkyl group, a $C_{1-10}$ alkoxy group, a $C_{6-40}$ aryl group, a formyl group, a carboxy group, or a hydroxy group; $R^7$ is selected from the group consisting of a hydrogen atom, a $C_{1-10}$ alkyl group, a $C_{6-40}$ aryl group, and a heterocyclic group, in which each of the alkyl group, the aryl group, and the heterocyclic group is an organic group that is optionally substituted with a halogen group, a nitro group, an amino group, or a hydroxy group, and $R^6$ and $R^7$ together with a carbon atom to which $R^6$ and $R^7$ are bound optionally form a ring);

as an eighth aspect, a polymer that is a copolymer, comprising: the unit structure (a1) as described in the fourth aspect; and the unit structure (B) as described in the seventh aspect;

as a ninth aspect, a resist underlayer film-forming composition for lithography, comprising: the polymer as described in any one of the first to the eighth aspects;

as a tenth aspect, the resist underlayer film-forming composition according to the ninth aspect, further comprising: a cross-linker;

as an eleventh aspect, the resist underlayer film-forming composition according to the ninth aspect or the tenth aspect, further comprising: an acid and/or an acid generator;

as a twelfth aspect, a resist underlayer film obtained by: applying the resist underlayer film-forming composition as described in any one of the ninth to the eleventh aspects onto a semiconductor substrate; and baking the applied resist underlayer film-forming composition;

as a thirteenth aspect, a method for manufacturing a semiconductor device, the method comprising: forming an underlayer film on a semiconductor substrate with the resist underlayer film-forming composition as described in any one of the ninth to the eleventh aspects; forming a resist film on the underlayer film; forming a resist pattern by irradiation with light or an electron beam followed by development; etching the underlayer film with the resist pattern; and processing the semiconductor substrate with the patterned underlayer film; and as a fourteenth aspect, a method for manufacturing a semiconductor device, the method comprising: forming an underlayer film on a semiconductor substrate with the resist underlayer film-forming composition as described in any one of the ninth to the eleventh aspects; forming a hardmask on the underlayer film; forming a resist film on the hardmask; forming a resist pattern by irradiation with light or an electron beam followed by development; etching the hardmask with the resist pattern; etching the underlayer film with the hardmask thus patterned; and processing the semiconductor substrate with the underlayer film thus patterned.

Effects of the Invention

By using the resist underlayer film-forming composition of the present invention, a good resist pattern can be formed without intermixing between a top layer of a resist underlayer film and a layer that covers the top layer.

The resist underlayer film-forming composition of the present invention can provide the capability of efficiently suppressing reflection from a substrate and thus can also provide an effect as an anti-reflective coating against exposure light.

By using the resist underlayer film-forming composition of the present invention, an excellent resist underlayer film having a selection ratio for a dry etching rate close to that of the resist, having a selection ratio for a dry etching rate smaller than that of the resist, or having a selection ratio for a dry etching rate smaller than that of the semiconductor substrate can be provided.

As resist patterns become finer, resist films are made to be thinner to avoid falling down of resist patterns after development. When such a thin resist film is used, a process in which a resist pattern is transferred onto its underlayer film by an etching process, and a substrate is processed by using the underlayer film as a mask; or a process in which a resist pattern is transferred onto an underlayer film under the resist by an etching process, and the pattern transferred onto the underlayer film is further transferred onto an underlayer film under the pattern-transferred underlayer film with a different gas composition is repeated to finally process a substrate. A resist underlayer film of the present invention and a forming composition thereof are effective for such processes. When a substrate is processed by using a resist underlayer film of the present invention, the substrate to be processed (for example, a thermally oxidized silicon film, a silicon nitride film, and a polysilicon film placed on a substrate) becomes sufficiently resistant to etching.

A resist underlayer film of the present invention can be used as a flattening film, a resist underlayer film, an anti-contamination film for a resist layer, or a film having selectivity for dry etching. Accordingly, a resist pattern can be easily and accurately formed in a lithography process for manufacturing a semiconductor.

There is a process including: forming a resist underlayer film on a substrate with a resist underlayer film-forming composition of the present invention; forming a hardmask on the resist underlayer film; forming a resist film on the hardmask; forming a resist pattern by exposure and development; transferring the resist pattern onto the hardmask; transferring the resist pattern transferred onto the hardmask onto the resist underlayer film; and processing a semiconductor substrate by using the resist underlayer film. In the process, the hardmask is formed with a coating type composition containing an organic polymer or an inorganic polymer, and a solvent; or with a vacuum-evaporated inorganic material. When an inorganic material (for example, silicon oxynitride) is vacuum-evaporated, the inorganic material is deposited on a surface of a resist underlayer film, and a temperature of the surface of the resist underlayer film increases to around 400° C. In the present invention, a polymer containing a unit structure of diarylamine novolac, such as phenylnaphthylamine novolac is used, and thus the present invention is highly heat-resistant, and is not thermally deteriorated by deposition of the evaporated materials.

A phenylnaphthylamine novolac resin of the present invention is used for a purpose different from that described above. In this case, the phenylnaphthylamine novolac resin has excellent transparency within a visible range, excellent heat-resistance, and a high refractive index, and is highly soluble in various solvents. By utilizing these properties, the phenylnaphthylamine novolac resin can be applied to various optical elements including a protective film for a liquid crystal display element, a TFT array flattening film, an overcoat for a color filter and the like, a spacer material, a light extraction improving film of an EL display, a light intake improving layer of an image sensor, and a light extraction improving layer of an LED element.

MODES FOR CARRYING OUT THE INVENTION

Figure 1:
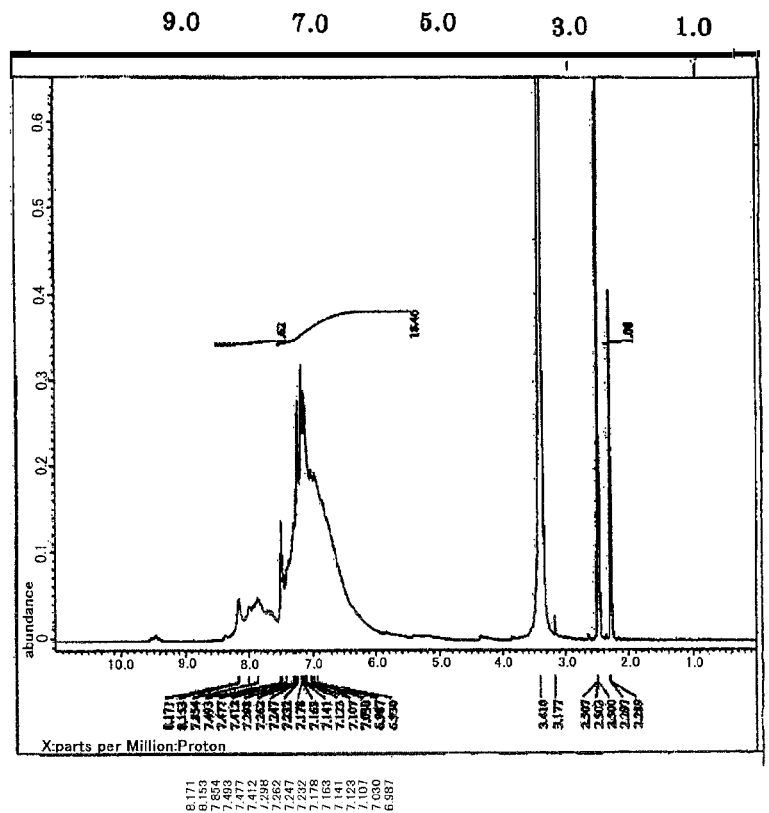
FIG. 1 shows the $^1$H-NMR spectrum of the polymer obtained in the synthesis example 1.

The present invention is a polymer comprising a unit structure (A) of Formula (1).

A polymer used in the present invention has a weight-average molecular weight of 600 to 1,000,000, or of 600 to 200,000.

A polymer used in the present invention comprises a repeating unit structure (A) of Formula (1).

In Formula (1), each of $Ar^1$ and $Ar^2$ is a benzene ring or a naphthalene ring, each of $R^1$ and $R^2$ is a substituent of a hydrogen atom on the benzene ring or the naphthalene ring and is selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, in which each of the alkyl group, the alkenyl group, and the aryl group is an organic group that optionally contains an ether bond, a ketone bond, or an ester bond;

$R^3$ is selected from the group consisting of a hydrogen atom, a $C_{1-10}$ alkyl group, a $C_{2-10}$ alkenyl group, a $C_{6-40}$ aryl group, and a combination thereof, in which each of the alkyl group, the alkenyl group, and the aryl group is an organic group that optionally contains an ether bond, a ketone bond, or an ester bond;

$R^4$ is selected from the group consisting of a $C_{6-40}$ aryl group and a heterocyclic group, in which each of the aryl group and the heterocyclic group is an organic group that is optionally substituted with a halogen group, a nitro group, an amino group, a $C_{1-10}$ alkyl group, a $C_{1-10}$ alkoxy group, a $C_{6-40}$ aryl group, a formyl group, a carboxy group, or a hydroxy group;

$R^5$ is selected from the group consisting of a hydrogen atom, a $C_{1-10}$ alkyl group, a $C_{6-40}$ aryl group, and a heterocyclic group, in which each of the alkyl group, the aryl group, and the heterocyclic group is an organic group that is optionally substituted with a halogen group, a nitro group, an amino group, or a hydroxy group, and $R^4$ and $R^5$ together with a carbon atom to which $R^4$ and $R^5$ are bound optionally form a ring. Each of $n_1$ and $n_2$ is independently an integer of 0 to 3.

Examples of the halogen group include a fluorine atom, a chlorine atom, a bromine atom, and an iodine atom.

Examples of the $C_{1-10}$ alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{2\text{-}10}$ alkenyl group include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the $C_{1\text{-}10}$ alkoxy group include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2,-trimethyl-n-propoxy group, a 1-ethyl-1-methyl-n-propoxy group, and a 1-ethyl-2-methyl-n-propoxy group.

Examples of the $C_{6\text{-}40}$ aryl group include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenyl group, a m-biphenyl group, a p-biphenyl group, a 1-anthryl group, a 2-anthryl group, a 9-anthryl group, a 1-phenanthryl group, a 2-phenanthryl group, a 3-phenanthryl group, a 4-phenanthryl group and a 9-phenanthryl group, and a pyrenyl group.

The heterocyclic group is an organic group preferably composed of a 5 to 6 membered heterocycle containing nitrogen, sulfur, and oxygen. Examples of the heterocyclic group include a pyrrole group, a furan group, a thiophene group, an imidazole group, an oxazole group, a thiazole group, a pyrazole group, an isoxazole group, an isothiazole group, and a pyridine group.

Of these, the heterocyclic group preferably contains sulfur in order to be used for a material having a high refractive index.

In the unit structure (A) of Formula (1), $R^5$ may be a hydrogen atom, and $R^4$ may be an optionally substituted phenyl group, an optionally substituted naphthyl group, an optionally substituted anthryl group, or an optionally substituted pyrenyl group.

In the unit structure (A) of Formula (1), $R^3$ is a hydrogen atom or a phenyl group.

In the unit structure (A) of the present invention, a unit structure (a1) in which either $Ar^1$ or $Ar^2$ is a benzene ring, and the other is a naphthalene ring, can be used; and a unit structure (a2) in which both $Ar^1$ and $Ar^2$ are benzene rings can also be used.

A polymer of the present invention can be a copolymer comprising the unit structures (a1) and (a2).

A polymer of the present invention can be a copolymer comprising the unit structure (A) of Formula (1) and the unit structure (B) of Formula (2).

In the unit structure (B), $R^6$ is selected from the group consisting of a $C_{6-40}$ aryl group and a heterocyclic group, in which each of the aryl group and the heterocyclic group is an organic group that is optionally substituted with a halogen group, a nitro group, an amino group, a $C_{1-10}$ alkyl group, a $C_{1-10}$ alkoxy group, a $C_{6-40}$ aryl group, a formyl group, a carboxy group, or a hydroxy group; $R^7$ is selected from the group consisting of a hydrogen atom, a $C_{1-10}$ alkyl group, a $C_{6-40}$ aryl group, and a heterocyclic group, in which each of the alkyl group, the aryl group, and the heterocyclic group is an organic group that is optionally substituted with a halogen group, a nitro group, an amino group, or a hydroxy group, and $R^6$ and $R^7$ together with a carbon atom to which $R^6$ and $R^7$ are bound optionally form a ring.

Examples of the substituent, alkyl group, aryl group, and heterocyclic group are described above.

A polymer of the present invention can be a copolymer comprising the unit structures (a1) and (B).

Examples of the polymer used in the present invention are shown below:

Formula (3-1)
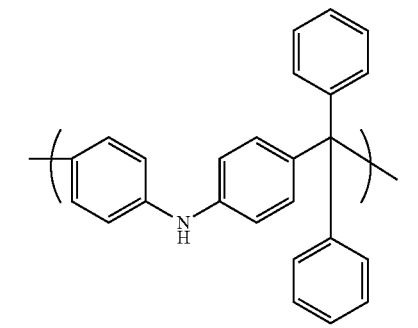

Formula (3-2)
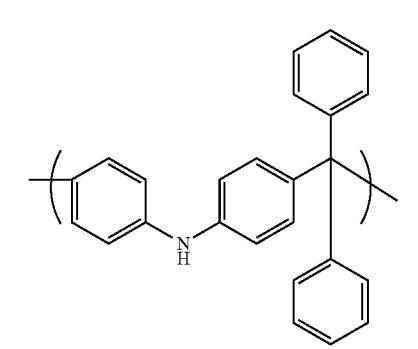

Formula (3-3)

Formula (3-4)
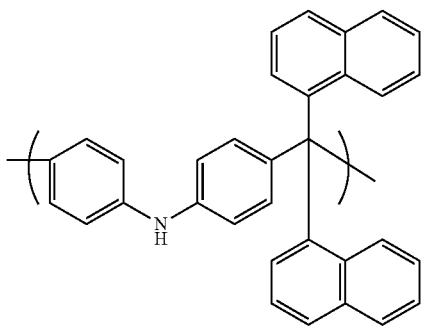

Formula (3-5)
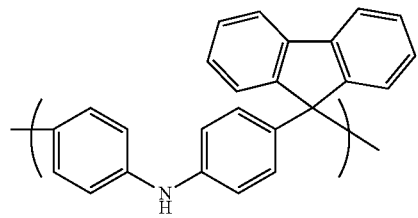

Formula (3-8)
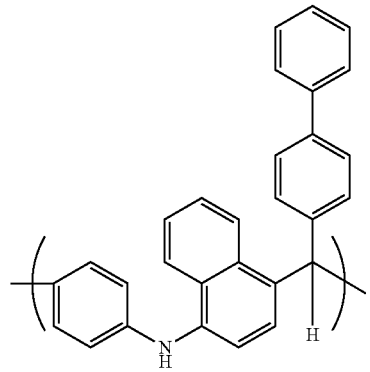

Formula (3-9)
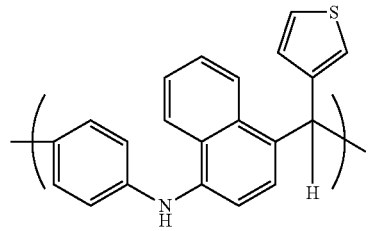

Formula (3-10)
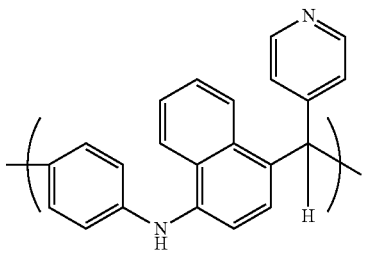

-continued
Formula (3-11)
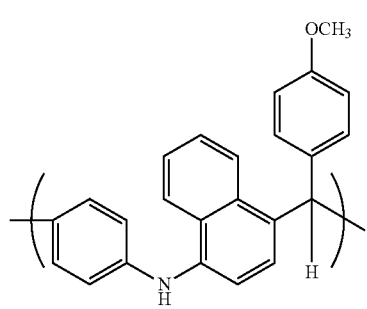
Formula (3-12)
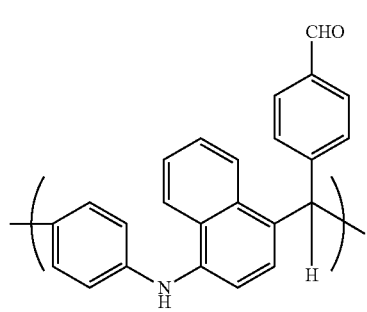
Formula (3-13)
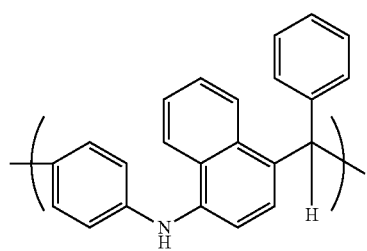
Formula (3-14)
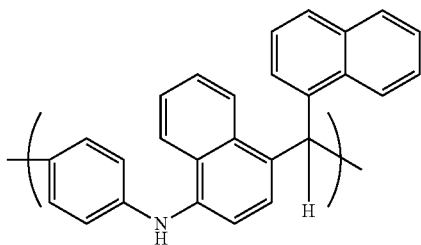
Formula (3-15)
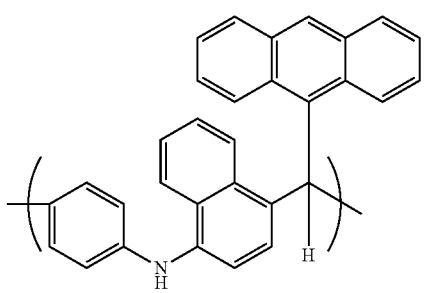
Formula (3-16)
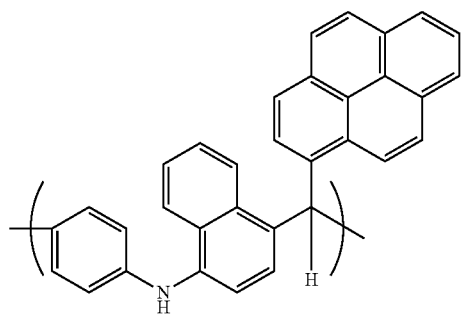
Formula (3-17)
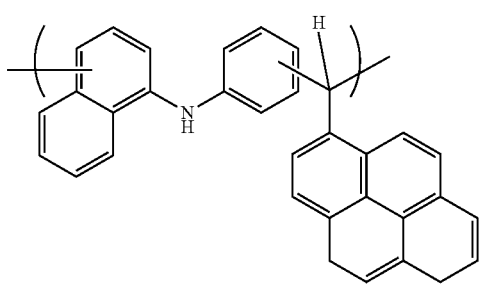
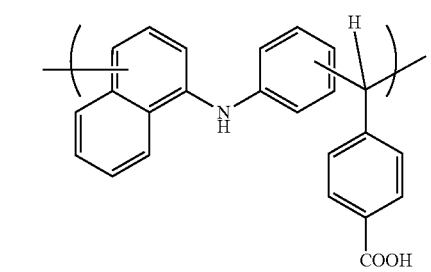
Formula (3-18)
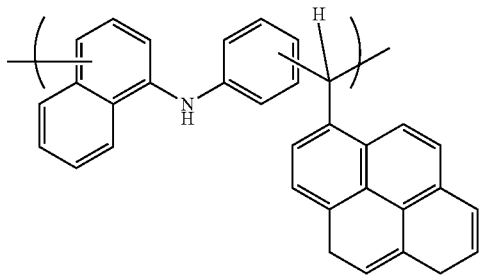
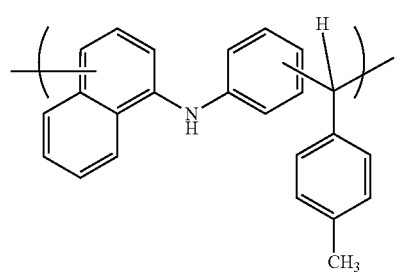

Formula (3-19)

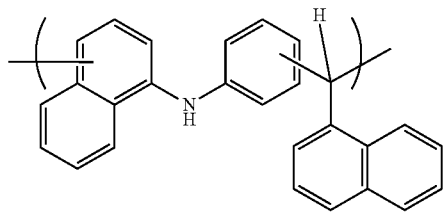

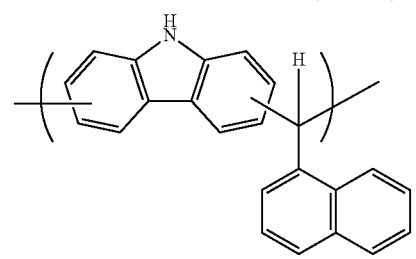

Formula (3-20)

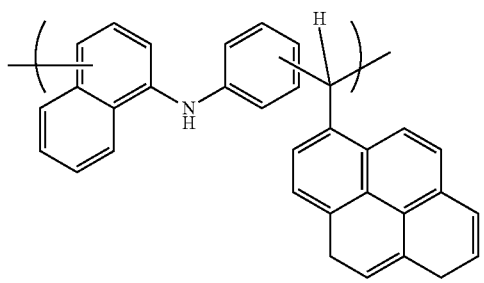

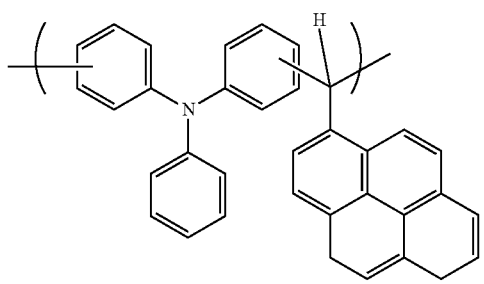

Formula (3-21)

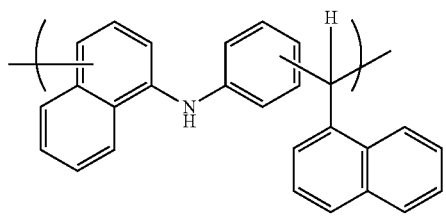

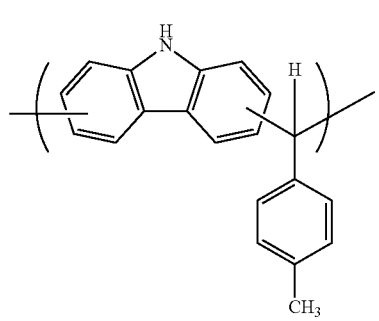

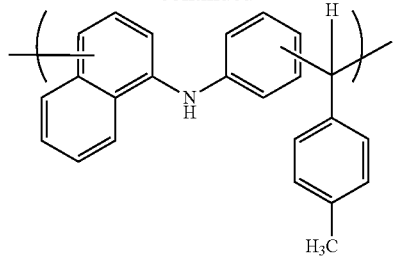

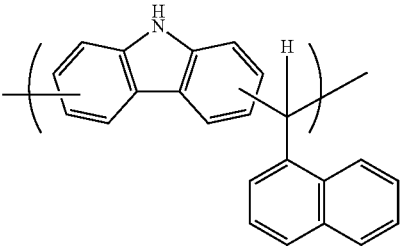

When carbazole is used in the present invention, examples thereof include carbazole, N-methylcarbazole, N-ethylcarbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4'bis(9H-carbazole-9-yl)biphenyl, 4-glycidylcarbazole, 4-hydroxycarbazole, 9-(1H-benzotriazole-1-ylmethyl)-9H-carbazole, 9-acetyl-3,6-diiodocarbazole, 9-benzoylcarbazole, 9-benzoylcarbazole-6-dicarboxyaldehyde, 9-benzylcarbazole-3-carboxyaldehyde, 9-methylcarbazole, 9-phenylcarbazole, 9-vinylcarbazole, potassium carbazole, carbazole-N-carbonyl chloride, N-ethylcarbazole-3-carboxyaldehyde, and N-((9-ethylcarbazole-3-yl)methylene)-2-methyl-1-indolinylamine. These may be used alone, or two or more of them may be used in combination.

When triphenylamine is used in the present invention, examples thereof include triphenylamine and substituted triphenylamine. Examples of the substituent include a halogen group, a nitro group, an amino group, a hydroxy group, a $C_{1-10}$ alkyl group, a $C_{2-10}$ alkenyl group, a $C_{6-40}$ aryl group, or a combination thereof that may contain an ether bond, a ketone bond, or an ester bond described above.

Examples of the aldehyde used for manufacturing a polymer of the present invention include saturated aliphatic aldehydes, such as formaldehyde, paraformaldehyde, acetaldehyde, propylaldehyde, butyraldehyde, isobutyraldehyde, valeraldehyde, capronaldehyde, 2-methylbutyraldehyde, hexylaldehyde, undecanaldehyde, 7-methoxy-3,7-dimethyloctylaldehyde, cyclohexane aldehyde, 3-methyl-2-butyraldehyde, glyoxal, malonaldehyde, succinaldehyde, glutaraldehyde, glutaraldehyde, and adipaldehyde; unsaturated aliphatic aldehydes, such as acrolein and methacrolein; hetero ring aldehydes, such as furfural, pyridine aldehyde, and thiophene aldehyde; and aromatic aldehydes, such as benzaldehyde, naphthaldehyde, anthracenecarboxaldehyde, phenylbenzaldehyde, anisaldehyde, terephthalaldehyde, pyrenecarboxaldehyde, phenanthryl aldehyde, salicylaldehyde, phenylacetaldehyde, 3-phenylpropionaldehyde, tolyl aldehyde, (N,N-dimethylamino)benzaldehyde, and acetoxybenzaldehyde. In particular, aromatic aldehydes can be preferably used.

Diarylketone is a ketone used for manufacturing a polymer of the present invention, and examples of the diarylketone include diphenylketone, phenyl naphthylketone, dinaphthylketone, phenyltolylketone, ditolylketone, and 9-fluorenone.

A polymer used for the present invention is a novolac resin (represented by Formula (1)) obtained by condensing an amine such as diarylamine and an aldehyde or a ketone.

In this condensation reaction, 0.1 to 10 equivalent of an aldehyde or a ketone can be used for 1 equivalent of a phenyl group of an amine such as diarylamine.

Examples of the acid catalyst used in the condensation reaction include mineral acids such as sulfuric acid, phosphoric acid, and perchloric acid; organic sulfonic acids such as p-toluenesulfonic acid and p-toluenesulfonic acid monohydrate; and carboxylic acids such as formic acid and oxalic acid. An amount of the acid catalyst is determined by taking into account types of acids used. Usually the amount is 0.001 part to 10,000 parts by mass, preferably 0.01 part to 1000 parts by mass, and more preferably 0.1 part to 100 parts by mass, relative to the total amount of carbazoles, or of carbazoles and triphenylamines of 100 parts by mass.

Although the condensation reaction can be conducted without any solvents, it is usually conducted with a solvent. Any types of solvents can be used as long as the solvent does not inhibit the reaction. Examples of the solvent include cyclic ethers such as tetrahydrofuran and dioxane. If the acid catalyst used is a liquid such as formic acid, the catalyst may also serve as a solvent.

The reaction temperature at the time of condensation is usually 40° C. to 200° C. Although the reaction time is determined by taking into account the reaction temperature, it is usually from 30 minutes to 50 hours.

The weight-average molecular weight Mw of the polymer obtained as described above is usually 600 to 1,000,000, or 600 to 200,000.

The present invention can be used as a resist underlayer film for lithography including the polymer described above, or as a resist underlayer film-forming composition for lithography to form the underlayer film.

In the present invention, the resist underlayer film-forming composition for lithography contains the polymer and solvent described above. The resist underlayer film-forming composition for lithography can further contain a cross-linker and an acid, and if needed, can contain an additive such as an acid generator and a surfactant. The solid content of the composition is 0.1% to 70% by mass, or 0.1% to 60% by mass. The solid content means a ratio of the total ingredient except for a solvent contained in the resist underlayer film-forming composition. The ratio of the polymer in the solid content is 1% to 100% by mass, or 1% to 99.9% by mass, or 50% to 99.9% by mass.

The polymer may contain another polymer at a ratio of not more than 30% by mass of the total polymer.

Examples of another polymer include a polyacrylic acid ester compound, a polymethacrylic acid ester compound, a polyacrylamide compound, a polymethacrylamide compound, a polyvinyl compound, a polystyrene compound, a polymaleimide compound, a polymaleic acid anhydride, and a polyacrylonitrile compound.

Examples of a monomer as a raw material of the polyacrylic acid ester compound include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxy butyl acrylate, isobutyl acrylate, tert-butyl acrylate, cyclohexyl acrylate, isobornyl acrylate, 2-methoxyethyl acrylate, methoxy triethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, and 5-acryloyloxy-6-hydroxynorbornene-2-carboxylic-6-lactone.

Examples of a monomer as a raw material of the polymethacrylic acid ester compound include ethyl methacrylate, normal propyl methacrylate, normal pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, normal lauryl methacrylate, normal stearyl methacrylate, methoxy diethylene glycol methacrylate, methoxy polyethylene glycol methacrylate, tetrahydrofurfuryl methacrylate, isobornyl methacrylate, tert-butyl methacrylate, isostearyl methacrylate, normal butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxy butyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone, and 2,2,3,3,4,4,4-heptafluorobutyl methacrylate.

Examples of the acrylamide compound include acrylamide, N-methyl acrylamide, N-ethyl acrylamide, N-benzyl acrylamide, N-phenyl acrylamide, and N,N-dimethyl acrylamide.

Examples of a monomer as a raw material of the polymethacrylamide compound include methacrylamide, N-methyl methacrylamide, N-ethyl methacrylamide, N-benzyl methacrylamide, N-phenyl methacrylamide, and N,N-dimethyl methacrylamide.

Examples of a monomer as a raw material of the polyvinyl compound include vinyl ether, methylvinyl ether, benzylvinyl ether, 2-hydroxyethylvinyl ether, phenylvinyl ether, and propylvinyl ether.

Examples of a monomer as a raw material of the polystyrene compound include styrene, methylstyrene, chlorostyrene, bromostyrene, and hydroxystyrene.

Examples of a monomer as a raw material of the polymaleimide compound include maleimide, N-methylmaleimide, N-phenylmaleimide, and N-cyclohexylmaleimide.

Each of these polymers can be manufactured by dissolving an addition polymerization monomer, and if needed, a chain transfer agent (not more than 10% by mass of the monomer) in an organic solvent; adding a polymerization initiator to conduct a polymerization reaction; and then adding a polymerization terminator. The addition amount of the polymerization initiator is 1% to 10% by mass of the monomer, and that of the polymerization terminator is 0.01% to 0.2% by mass of the monomer. Examples of the organic solvent used include propylene glycol monomethyl ether, propylene glycol monopropyl ether, ethyl lactate, cyclohexanone, methyl ethyl ketone, and dimethylformamide. Examples of the chain transfer agent include dodecanethiol and dodecylthiol. Examples of the polymerization initiator include azobisisobutyronitrile and azobiscyclohexanecarbonitrile. An example of the polymerization terminator is 4-methoxy phenol. The reaction temperature is suitably selected within the range from 30° C. to 100° C., and the reaction time is suitably selected within the range from 1 hour to 48 hours.

A resist underlayer film-forming composition of the present invention may contain a cross-linker component. Examples of the cross-linker include melamine cross-linkers and substituted urea cross-linkers; and polymers thereof. The cross-linker preferably has at least two cross-linking substituents, and examples thereof include compounds of methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Condensates of these compounds can also be used.

A highly heat-resistant cross-linker may be used as the cross linker described above. Such a highly heat-resistant cross-linker is preferably a compound containing a cross-linking substituent having an aromatic ring (for example, a benzene ring and a naphthalene ring). Examples of the compound include a compound having a partial structure of Formula (4) below, and a polymer or an oligomer having a repeating unit of Formula (5) below.

In Formula (4), each of $R^9$ and $R^{10}$ is a hydrogen atom, a $C_{1-10}$ alkyl group, or a $C_{6-20}$ aryl group; n6 is an integer of 1 to 4, n7 is an integer of 1 to (5-n6), and (n6+n7) is an integer of 2 to 5.

In Formula (5), $R^{11}$ is a hydrogen atom or a $C_{1-10}$ alkyl group, $R^{12}$ is a $C_{1-10}$ alkyl group, n8 is an integer of 1 to 4, n9 is an integer of 0 to (4-n8), and (n8+n9) is an integer of 1 to 4. An oligomer or a polymer having 2 to 100, or 2 to 50 unit structures can be used.

Examples of these alkyl groups and aryl groups can be the alkyl groups and aryl groups described above.

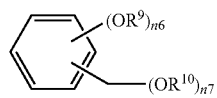

Formula (4)

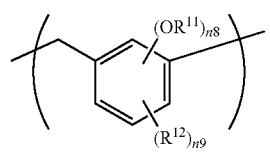

Formula (5)

Examples of the compounds, polymers, and oligomers of Formulae (4) and (5) are shown below.

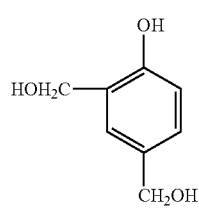

Formula (4-1)

-continued

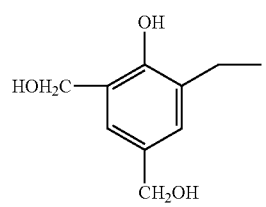

Formula (4-2)

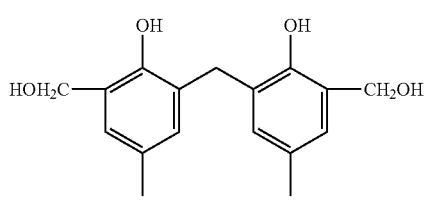

Formula (4-3)

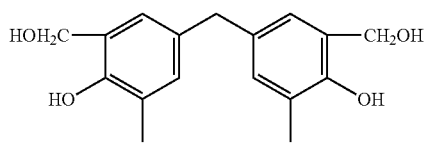

Formula (4-4)

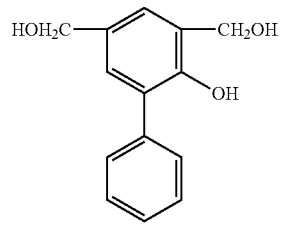

Formula (4-5)

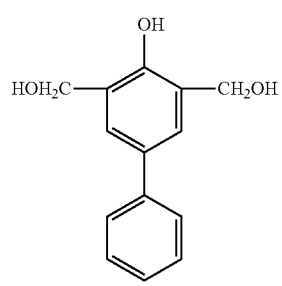

Formula (4-6)

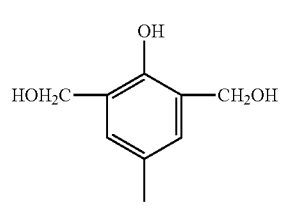

Formula (4-7)

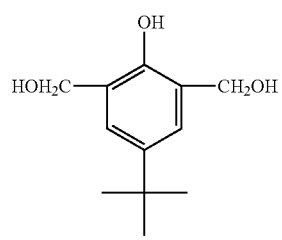

Formula (4-8)

Formula (4-9)
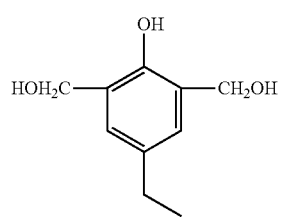
Formula (4-10)
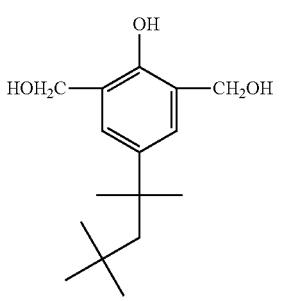
Formula (4-11)
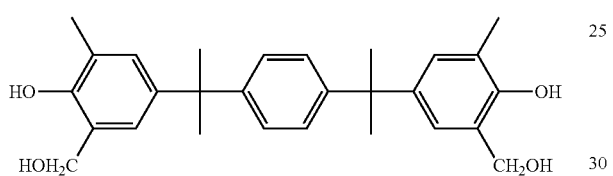
Formula (4-12)
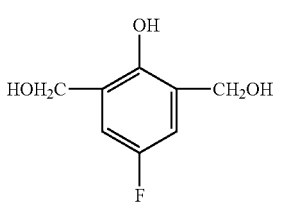
Formula (4-13)
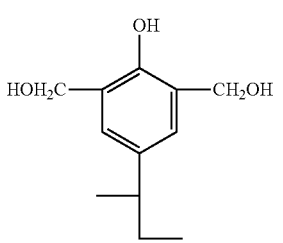
Formula (4-14)
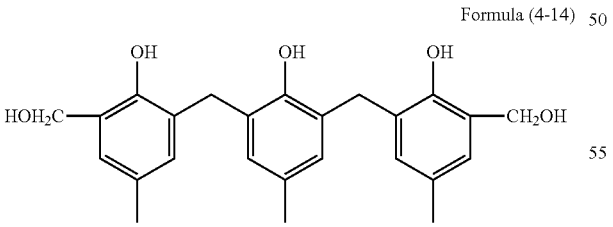
Formula (4-15)
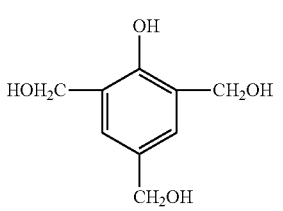
Formula (4-16)
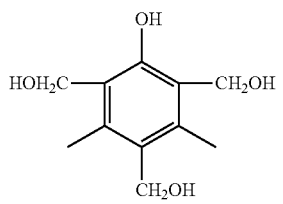
Formula (4-17)
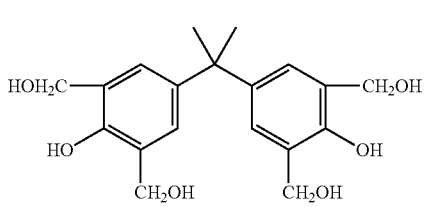
Formula (4-18)
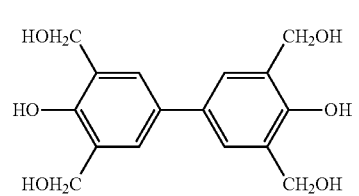
Formula (4-19)
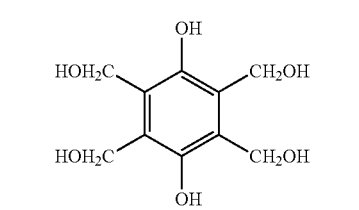
Formula (4-20)
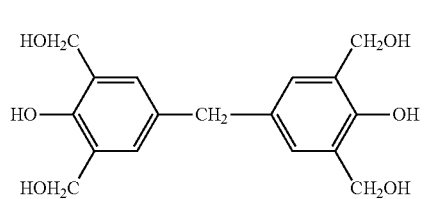
Formula (4-21)
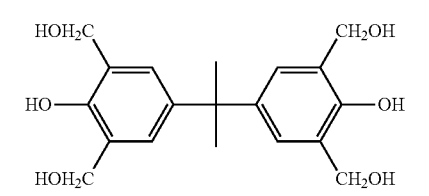
Formula (4-22)
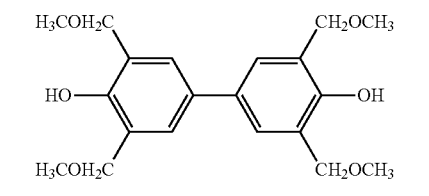
Formula (4-23)
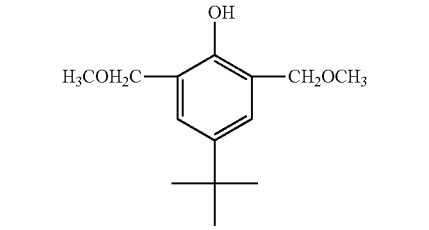

-continued

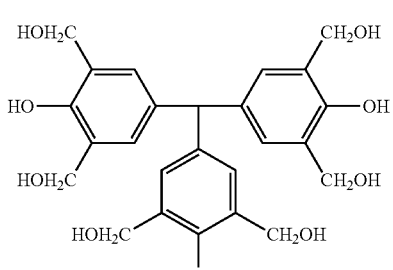

Formula (4-24)

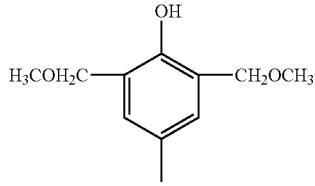

Formula (4-25)

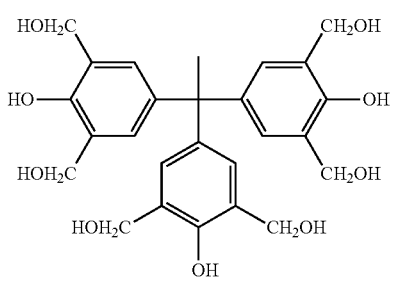

Formula (4-26)

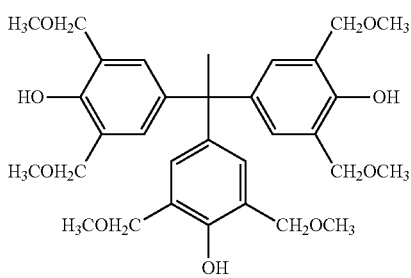

Formula (4-27)

The compounds above can be available as products manufactured by Asahi Organic Chemicals Industry Co., Ltd. and Honshu Chemical Industry Co., Ltd. For example, the compound of Formula (4-21) (Asahi Organic Chemicals Industry Co., Ltd., the product name: TM-BIP-A) and the compound of Formula (4-22) (Honshu Chemical Industry Co., Ltd., the product name: TMOM-BP) can be used, among the cross-linkers above.

Although the addition amount of the cross-linker may vary depending on a coating solvent used, a substrate used as a base material, a required solution viscosity, a required film shape, and the like, it is 0.001% to 80% by mass, preferably 0.01% to 50% by mass, and more preferably 0.05% to 40% by mass of the total solid content. These cross-linkers may induce cross-linking reactions by self-condensation; however, when the polymers of the present invention contain crosslinkable substituents, cross-linking reactions may occur with those crosslinkable substituents.

According to the present invention, an acid compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalenecarboxylic acid; and/or a thermal acid generator such as 2,4,4,6-tetrabromocyclohexadienone, benzoin tosylate, 2-nitrobenzyl tosylate, and an organic sulfonic acid alkyl ester; may be blended as a catalyst to facilitate the cross-linking reaction. The blending amount is 0.0001% to 20% by mass, preferably 0.0005% to 10% by mass, and preferably 0.01% to 3% by mass of the total solid content.

A coating type underlayer film-forming composition for lithography of the present invention may contain a photoacid generator, in order to obtain the acidity same as that of a photoresist that is formed on the underlayer in the lithography step. Preferable examples of the photoacid generator include onium salt photoacid generators, such as bis(4-t-butylphenyl) iodonium trifluoromethanesulfonate and triphenylsulfonium trifluoromethanesulfonate; halogen containing compound photoacid generators, such as phenyl-bis(trichloromethyl)-s-triazine; and sulfonic acid photoacid generators, such as benzoin tosylate and N-hydroxysuccinimide trifluoromethanesulfonate. The photoacid generator described above is contained as 0.2% to 10% by mass, preferably 0.4% to 5% by mass of the total solid content.

In addition to the agents described above, a resist underlayer film material for lithography of the present invention may also contain an additional light absorbing agent, a rheology modifier, an adhesion auxiliary agent, a surfactant, and the like, if needed.

Examples of the additional light absorbing agent suitably used include commercially available light absorbing agents described in "Technology and Market of Industrial Dye" (CMC publisher) and "Dyestuff Handbook" (Edited by the Society of Synthetic Organic Chemistry, Japan), such as, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2, and 45; C. I. Solvent Red 1, 3, 8, 23, 24, 25, 27, and 49; C. I. Pigment Green 10; and C. I. Pigment Brown 2. The light absorbing agent described above is mixed in a resist underlayer film material for lithography at a ratio of not more than 10% by mass, and preferably not more than 5% by mass of the total solid content of the resist underlayer film material for lithography.

A rheology modifier is added to a resist underlayer film-forming composition mainly in order to improve fluidity, so that, particularly in the baking step, uniformity of the film thickness of the resist underlayer film and filling properties of the resist underlayer film-forming composition inside the hole are increased. Specific examples of the rheology modifier include phthalic acid derivatives, such as dimethyl phthalate, diethyl phthalate, diisobutyl phthalate, dihexyl phthalate, and butyl isodecyl phthalate; adipic acid derivatives, such as di-normal-butyl adipate, diisobutyl adipate, diisooctyl adipate, and octyl decyl adipate; maleic acid derivatives, such as di-normal-butyl maleate, diethyl maleate, and dinonyl maleate; oleic acid derivatives, such as methyl oleate, butyl oleate, and tetrahydrofurfuryl oleate; and stearic acid derivatives, such as normal butyl stearate and glyceryl stearate. The rheology modifier is mixed in a resist underlayer film material for lithography usually at a ratio of less than 30% by mass of the total solid content of the resist underlayer film material for lithography.

An adhesion auxiliary agent is added mainly in order to improve adhesion between a substrate or a resist and the resist underlayer film-forming composition, so that a resist is not peeled off particularly during development. Specific examples of the adhesion auxiliary agent include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazol, urazole, thiouracil, mercaptoimidazole, and mercaptopyrimidine; ureas such as 1,1-dimethylurea and 1,3-dimethyl urea; and thiourea compounds. The adhesion auxiliary agent is blended in a resist underlayer film material for lithography usually at a ratio of less than 5% by mass, preferably less than 2% by mass of the total solid content of the resist underlayer film material for lithography.

A surfactant may be blended in the resist underlayer film material for lithography of the present invention in order to avoid generation of pinholes and striation, and further improve coating properties on an uneven surface. Examples of the surfactant include nonionic surfactants including polyoxyethylene alkylethers, such as polyoxyethylene lauryl ether, polyoxyethylene stearyl ether, polyoxyethylene cetyl ether, and polyoxyethylene oleyl ether; polyoxyethylene alkylarylethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including Eftop EF301, EF303, and EF352 (manufactured by Tohkem Products Co., Ltd., product name), MEGAFAC F171, F173, and R-30 (manufactured by Dainippon Ink and Chemicals, Incorporated, product name), Fluorad FC430 and FC431 (manufactured by Sumitomo 3M Limited, product name), and AsahiGuard AG710, SURFLON S-382, SC101, SC102, SC103, SC104, SC105, and SC106 (manufactured by Asahi Glass Co., Ltd., product name); and organosiloxane polymer KP341 (manufactured by Shin-Etsu Chemical Co., Ltd.). A blending amount of the surfactant is usually not more than 2.0% by mass, preferably not more than 1.0% by mass of the total solid content of a resist underlayer film material for lithography of the present invention. These surfactants may be added singly, or in combination of two or more of them.

In the present invention, a solvent that can be used to dissolve the polymer, cross-linker component, cross-linking catalyst, and the like includes ethylene glycol monomethyl ether, ethylene glycol monoethyl ether, ethylene glycol monobutyl ether, ethylene glycol monoisopropyl ether, ethylene glycol methylether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methylethyl ketone, cyclopentanone, cyclohexanone, 2-hydroxypropionic acid ethyl ester, 2-hydroxy-2-methyl propionic acid ethyl ester, ethoxyethyl acetate, hydroxyacetic acid ethyl ester, 2-hydroxy-3-methyl butane acid methyl ester, 3-methoxypropionic acid methyl ester, 3-methoxy propionic acid ethyl ester, 3-ethoxypropionic acid ethyl ester, 3-ethoxypropionic acid methyl ester, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, benzyl alcohol, 1,3-butanediol, 1,4-butanediol, 2,3-butanediol, γ-butyl lactone, acetone, methyl isopropyl ketone, diethyl ketone, methyl isobutyl ketone, methyl normal butyl ketone, isopropyl acetate ketone, normal propyl acetate, isobutyl acetate, methanol, ethanol, isopropanol, tert-butanol, allyl alcohol, normal propanol, 2-methyl-2-butanol, isobutanol, normal butanol, 2-methyl-1-butanol, 1-pentanol, 2-methyl-1-pentanol, 2-ethyl hexanol, isopropyl ether, 1,4-dioxane, N,N-dimethylformamide, N,N-dimethylacetamide, N-methyl pyrrolidone, 1,3-dimethyl-2-imidazolidinone, dimethyl sulfoxide, and N-cyclohexyl-2-pyrrolidinone. These organic solvents may be used singly or in combination of two or more of them.

Further, solvents having high boiling points, such as propylene glycol monobutyl ether and propylene glycol monobutyl ether acetate can be mixed for use. Among these solvents, propylene glycol mono methylether, propylene glycol monomethyl ether acetate, propylene glycol monobutyl ether, ethyl lactate, butyl lactate, and cyclohexanone are preferable to improve leveling.

The resist used in the present invention is a photoresist and an electron beam resist.

In the present invention, both of a negative-type, and a positive-type photoresist can be applied onto top of the resist underlayer film for lithography. Examples include a positive-type photoresist that contains a novolac resin and 1,2-naphthoquinone diazide sulfonic acid ester; a chemically amplified resist that contains a binder having a group decomposed with acid to increase an alkali dissolution rate, and a photoacid generator; a chemically amplified photoresist that contains an alkali-soluble binder, a low molecular weight compound decomposed with acid to increase an alkali dissolution rate of photoresist, and a photoacid generator; a chemically amplified photoresist that contains a binder having a group decomposed with acid to increase an alkali dissolution rate, a low molecular weight compound decomposed with acid to increase an alkali dissolution rate of photoresist, and a photoacid generator; and a photoresist having an Si atom in its backbone; and a specific example is APEX-E (product name) manufactured by Rohm and Haas Company.

Examples of the electron beam resist applied onto top of the resist underlayer film for lithography of the present invention include a composition containing a resin having an Si—Si bond in its main chain and having an aromatic ring on its terminal, and containing an acid generator that generates acid by irradiation with an electron beam; and a composition containing poly(p-hydroxystyrene) in which a hydroxy group is substituted with an organic group having N-carboxyamine, and containing an acid generator that generates acid by irradiation with an electron beam. In the latter electron beam resist composition, acid generated from an acid generator by irradiation with an electron beam reacts with an N-carboxy aminooxy group that is on a side chain of a polymer, and the side chain of the polymer is split into a hydroxy group, and then show alkali solubility to be dissolved in an alkali developing solution, so that a resist pattern is formed. Examples of the acid generator that generates acid by irradiation with an electron beam include halogenated organic compounds, such as 1,1-bis(p-chlorophenyl)-2,2,2-trichloroethane, 1,1-bis(p-methoxyphenyl)-2,2,2-trichloroethane, 1,1-bis(p-chlorophenyl)-2,2-dichloroethane, and 2-chloro-6-(trichloromethyl) pyridine; onium salts, such as triphenylsulfonium salt and diphenyliodonium salt; and sulfonic acid esters, such as nitrobenzyl tosylate and dinitrobenzyl tosylate.

As developing solutions for a resist having a resist underlayer film, which is formed by using a resist underlayer film material for lithography of the present invention, aqueous solutions of alkalis, including inorganic alkalis, such as sodium hydroxide, potassium hydroxide, sodium carbonate, sodium silicate, sodium metasilicate, and aqueous ammonia; primary amines, such as ethylamine and n-propylamine; secondary amines, such as diethylamine and di-n-butylamine; tertiary amines, such as triethylamine and diethylmethylamine; alcohol amines, such as dimethyl ethanolamine and triethanolamine; quaternary ammonium salts, such as tetramethylammonium hydroxide, tetraethylammonium hydroxide, and choline; cyclic amines, such as pyrrole and piperidine; can be used. Further, suitable amounts of alcohols, such as isopropyl alcohol; and surfactants, such as nonionic surfactants can also be added to the aqueous solutions of alkalis described above and used. Among them, preferable developing solutions are quaternary ammonium salts, and more preferably, are tetramethylammonium hydroxide and choline.

In a method for forming a resist pattern of the present invention, a resist underlayer film-forming composition is applied onto a substrate used for manufacturing a precision integrated circuit element (for example, transparent substrates, such as a silicon/silicon dioxide coating, a glass substrate, and an ITO substrate) by a suitable coating method using a spinner, a coater, or the like, and then the resist underlayer film-forming composition is baked to be cured so that a coating type underlayer film is formed. Here, the film thickness of the resist underlayer film is preferably 0.01 µm to 3.0 µm. A condition of baking after coating is at a temperature of 80° C. to 350° C., for 0.5 minute to 120 minutes. After that, a resist is applied onto a resist underlayer film directly, or after one or several layers are formed on the coating type underlayer film with a film-coating material as needed. The resist is irradiated with light or an electron beam through a given mask, and then developed, rinsed, and dried to obtain a good resist pattern. If needed, post exposure bake (PEB) may be conducted after irradiation with light or an electron beam. A portion of the resist underlayer film where the resist has been removed by development can be further removed by dry etching so that a desired pattern can be formed on the substrate.

Exposure light for the photoresist may be an actinic ray such as near ultraviolet, far ultraviolet, and extreme ultraviolet (for example, EUV having the wavelength of 13.5 nm), and the light having a wavelength of, for example, 248 nm (KrF laser light), 193 nm (ArF laser light), or 157 nm ($F_2$ laser light) is used. A method of irradiation with light is not particularly limited, as long as acid can be generated from a photoacid generator, and an amount of exposure is 1 mJ/cm$^2$ to 2000 mJ/cm$^2$, 10 mJ/cm$^2$ to 1500 mJ/cm$^2$, or 50 mJ/cm$^2$ to 1000 mJ/cm$^2$.

Irradiation of an electron beam resist with an electron beam may be conducted by using, for example, an electron beam irradiation device.

In the present invention, a semiconductor device can be manufactured through the steps of: forming the resist underlayer film on a semiconductor substrate with a resist underlayer film-forming composition; forming a resist film on the resist underlayer film; forming a resist pattern by irradiation with light or an electron beam followed by development; etching the resist underlayer film with the resist pattern; and processing the semiconductor substrate with the patterned resist underlayer film As resist patterns become finer in the future, resist films are required to be thinner to overcome resolution issues, or to avoid falling down of resist patterns after development. Thus, it is difficult for the resist pattern to have a film thickness sufficient to process the substrate. Accordingly, in addition to a resist pattern, a resist underlayer film formed between a resist and a semiconductor substrate to be processed is also required to serve as a mask when the substrate is processed. As a resist underlayer film to be used in such a process, there is required a resist underlayer film for lithography having a selection ratio for a dry etching rate close to that of the resist, having a selection ratio for a dry etching rate smaller than that of the resist, or having a selection ratio for a dry etching rate smaller than that of the semiconductor substrate, unlike conventional high etch rate resist underlayer films.

Meanwhile, when dry etching of a resist underlayer film is conducted, a process has started to be used in which both a resist pattern and a resist underlayer film are made to be thinner than a pattern width at the time of developing the resist in order to obtain a fine resist pattern. As different from conventional high etch rate anti-reflective coatings, a resist underlayer film for such process having a selection ratio for a dry etching rate close to that of the resist has been needed. To such a resist underlayer film, an anti-reflective property can be imparted, and the resist underlayer film can also serve as a conventional anti-reflective coating.

In the present invention, after a resist underlayer film of the present invention is formed on a substrate, a resist can be applied onto the resist underlayer film directly, or after one or several layers are formed on the resist underlayer film with a film-coating material as needed. Accordingly, a width of the resist pattern becomes narrow, and the substrate can be processed by choosing a suitable etching gas, even if the resist is applied as a thin layer in order to prevent falling down of the resist pattern.

That is, a semiconductor device can be manufactured through the steps of: forming the resist underlayer film on a semiconductor substrate with a resist underlayer film-forming composition; forming a hardmask prepared with a film-coating material containing a silicon component and the like or a hardmask prepared by vacuum evaporation (for example, silicon oxynitride) on the resist underlayer film; forming a resist film on the hardmask; forming a resist pattern by irradiation with light or an electron beam followed by development; etching the hardmask with the resist pattern by using a halogen-based gas; etching the resist underlayer film with the patterned hardmask by using an oxygen-based gas or a hydrogen-based gas; and processing the semiconductor substrate with the patterned resist underlayer film by using a halogen-based gas.

When the effect as an anti-reflective coating is considered, a resist underlayer film-forming composition for lithography of the present invention is excellent for preventing reflected light. This is because the composition has a light absorption moiety in its backbone, which prevents substances from being diffused in the photoresist when the composition is heated and dried, and also the light absorption moiety is sufficiently light-absorbable.

A resist underlayer film-forming composition for lithography of the present invention is highly heat-stable and can prevent contamination of a top layer film with the decomposed product during baking. In addition, the temperature at the baking step can have a wide margin.

In a certain condition of a process, a resist underlayer film material for lithography of the present invention can be used as a film having functions of preventing light reflection, preventing interaction between a substrate and photoresist, and preventing adverse effect to a substrate induced by a material used for photoresist or by a substance generated when photoresist is exposed to light.

According to the present invention, a polymer containing a triphenylamine ring and a polymer containing a carbazole ring can be provided for a purpose different from that of the resist underlayer film described above. There polymers are highly heat-resistant, highly transparent, having high refractive indexes, and highly soluble by themselves alone, without the use of any metal oxides.

That is, a film-forming composition having a high refractive index can be obtained, in which the film-forming composition contains a polymer comprising the unit structure of Formula (1) (for example, a phenylnaphthylamine novolac resin). A film having a high refractive index can be obtained by applying the film-forming composition having a high refractive index described above, and thus an electronic device in which the film having a high refractive index is used can be obtained. The weight-average molecular weight of a polymer used for this purpose is 1,000 to 2,000,000, and the polymer is a highly branched polymer or a linear polymer.

A film-forming composition having a high refractive index used to obtain a film having a high refractive index includes a polymer and a solvent. A solid content is not particularly limited, as long as the content is within a range in which preservation stability is not affected, and is suitably chosen depending on a thickness of a targeted film. Specifically, from the viewpoints of solubility and preservation stability, the solid content is preferably 0.1% to 50% by mass, and more preferably 0.1% to 20% by mass. Examples of the solvent include the solvents described above.

The solid content may include the polymer described above (for example, a phenylnaphthylamine novolac resin) at a ratio of 1% to 100% by mass, or 1% to 99.9% by mass, or 50% to 99.9% by mass. In addition to the polymer and solvent, the solid content may also include other components, such as the leveling agent, surfactant, and cross-linker described above as long as effects of the present invention are not impaired.

By employing a polymer backbone of the present invention, high heat-resistance and high transparency can be maintained. Even when monomer units are used, which have been thought to lose heat-resistance and transparency, physical properties may be controlled only by changing the polymer backbone to a partial structure of the present invention.

Moreover, although the compound has a high molecular weight, it has low viscosity when dissolved in a solvent, and thus is easy for handling.

The polymer alone can have a high refractive index without containing any metal oxides. Accordingly, when dry processes such as etching and ashing are conducted, an etch rate becomes constant to allow formation of a film having a uniform thickness, and thus a process margin when a device is produced is extended.

Various properties of a polymer containing a triphenylamine ring and a polymer containing a carbazole ring of the present invention can be controlled by changing a type of the monomer that is a starting material for the synthesis.

A polymer containing phenylnaphthylamine of the present invention can be used as a highly heat-resistant insulating material.

A film formed with a polymer containing phenylnaphthylamine of the present invention has high heat-resistance, high transparency, high refractive indexes, and high solubility as explained above, low volume contraction, and the like. Such a film can preferably be used as an element for manufacturing electronic devices, such as a liquid crystal display, an organic electroluminescent (EL) display, an optical semiconductor (LED) element, a solid state image sensor, an organic thin film solar cell, a dye sensitized solar cell, and an organic thin film transistor (TFT).

The present invention also relates to a composition of the polymer described above and another polymer (a thermoplastic resin or a thermoplastic resin composition) utilized for these uses.

Specific examples of the polymer include a polyethylene resin, a polypropylene resin, a polystyrene resin, an acrylonitrile/butadiene/styrene resin (ABS), a polycarbonate resin, a polyethylene terephthalate resin, a polyamide resin, a polyimide resin, a (meth)acrylic resin, a polyester resin (including polyethylene terephthalate), a polynorbornene resin, a polylactic acid resin, a polyurethane resin, a polyether resin, a polyethersulfone resin, a polyether ketone resin, a polythioether resin, a phenol resin, an urea resin, a melamine resin, an unsaturated polyester resin, and an epoxy resin, but not particularly limited thereto. The resin is used preferably within a range of 1 part to 10,000 parts by mass, and more preferably 1 part to 1,000 parts by mass, relative to the polymer of 100 parts by mass.

For example, a composition with a (meth)acrylic resin can be obtained by mixing a (meth)acrylate compound and the polymer, followed by polymerizing the (meth)acrylate compound.

Examples of the (meth)acrylate compound include methyl (meth)acrylate, ethyl (meth)acrylate, ethylene glycol di(meth)acrylate, tetraethylene glycol di(meth)acrylate, polyethylene glycol di(meth)acrylate, propylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, trimethylolpropane trioxyethyl (meth)acrylate, tricyclodecane dimethanol di(meth)acrylate, tricyclodecanyl di(meth)acrylate, trimethylolpropane trioxypropyl (meth)acrylate, tris-2-hydroxyethyl isocyanurate tri(meth)acrylate, tris-2-hydroxyethyl isocyanurate di(meth)acrylate, 1,9-nonanediol di(meth)acrylate, pentaerythritol di(meth)acrylate, glycerin methacrylate acrylate, pentaerythritol tri(meth)acrylate, trimethylolpropane trimethacrylate, (meth)acrylic acid allyl ester, (meth)acrylic acid vinyl ester, epoxy (meth)acrylate, polyester (meth)acrylate, and urethane (meth)acrylate.

Polymerization of these (meth)acrylate compounds can be conducted by photoirradiation or heating, under the presence of photo radical initiator or a thermal radical initiator. Examples of the photo radical polymerization initiator include acetophenones, benzophenones, Michler's benzoyl benzoate, amidoxime esters, tetramethylthiuram monosulfide, and thioxanthones.

In particular, a photofragmentation type photo radical polymerization initiator is preferable. A description about the photofragmentation type photo radical polymerization initiator is found in "The Latest UV Curing Technique" (page 159, Technical Information Institute Co. Ltd., published on 1991).

Examples of the commercially available photo radical polymerization initiator include IRGACURE 184, 369, 651, 500, 819, 907, 784, 2959, CGI 1700, CGI 1750, CGI 1850, and CG24-61, DAROCUR 1116 and 1173 (product name) manufactured by Ciba Japan K.K.; Lucirin TPO (product name) manufactured by BASF Japan Ltd.; EBECRYL P36 (product name) manufactured by UCB Chemicals; and ESACURE KIP 150, KIP 65LT, KIP 100F, KT 37, KT 55, KTO 46, KIP 75/B (product name) manufactured by Fratelli Lamberti S.P.A.

The photopolymerization initiator is used preferably within a range of 0.1 part to 15 parts by mass, and more preferably 1 part to 10 parts by mass, relative to the (meth)acrylate compound of 100 parts by mass.

The solvents described above for the film-forming composition can be used at the time of polymerization.

EXAMPLES

Synthesis Example 1

N-phenyl-1-naphthylamine (8.00 g, 0.036 mol, manufactured by Tokyo Chemical Industry Co., Ltd.), benzaldehyde (3.87 g, 0.036 mol, manufactured by Tokyo Chemical Industry Co., Ltd.), and para-toluenesulfonic acid monohydrate (0.727 g, 0.0036 mol, manufactured by Kanto Chemical Co., Inc.) were placed in a 100 mL four-neck flask, and then toluene (37.92 g, manufactured by Kanto Chemical Co., Inc.) was added thereto and stirred. The temperature was raised to 110° C. to dissolve the content so that polymerization is initiated. After 12 hours, the content was left to cool to 60° C. and re-precipitated in methanol (400 g, manufactured by Kanto Chemical Co., Inc.). The obtained precipitate was filtered and dried in a vacuum dryer at 50° C. for 10 hours, and then further dried at 120° C. for 24 hours to obtain 8.5 g of the target polymer (represented by Formula (3-13)), hereinafter, abbreviated as pNPNA-BA).

The weight-average molecular weight Mw of pNPNA-BA measured by GPC was 11,000 in terms of polystyrene, and polydispersity Mw/Mn was 7.3. The NMR spectrum of pNPNA-BA is shown in FIG. 1.

Synthesis Example 2

N-phenyl-1-naphthylamine (10.00 g, 0.046 mol, manufactured by Tokyo Chemical Industry Co., Ltd.), 1-naphthaldehyde (7.12 g, 0.046 mol, manufactured by Tokyo Chemical Industry Co., Ltd.), and para-toluenesulfonic acid monohydrate (0.908 g, 0.0046 mol, manufactured by Kanto Chemical Co., Inc.) were placed in a 100 mL four-neck flask, and then 1,4-dioxane (21.03 g, manufactured by Kanto Chemical Co., Inc.) was added thereto and stirred. The temperature was raised to 110° C. to dissolve the content so that polymerization is initiated. After 12 hours, the content was left to cool to a room temperature and re-precipitated in methanol (400 g, manufactured by Kanto Chemical Co., Inc.). The obtained precipitate was filtered and dried in a vacuum dryer at 50° C. for 10 hours, and then further dried at 120° C. for 24 hours to obtain 11.6 g of the target polymer (represented by Formula (3-14)), hereinafter, abbreviated as pNPNA-NA).

Figure 2:
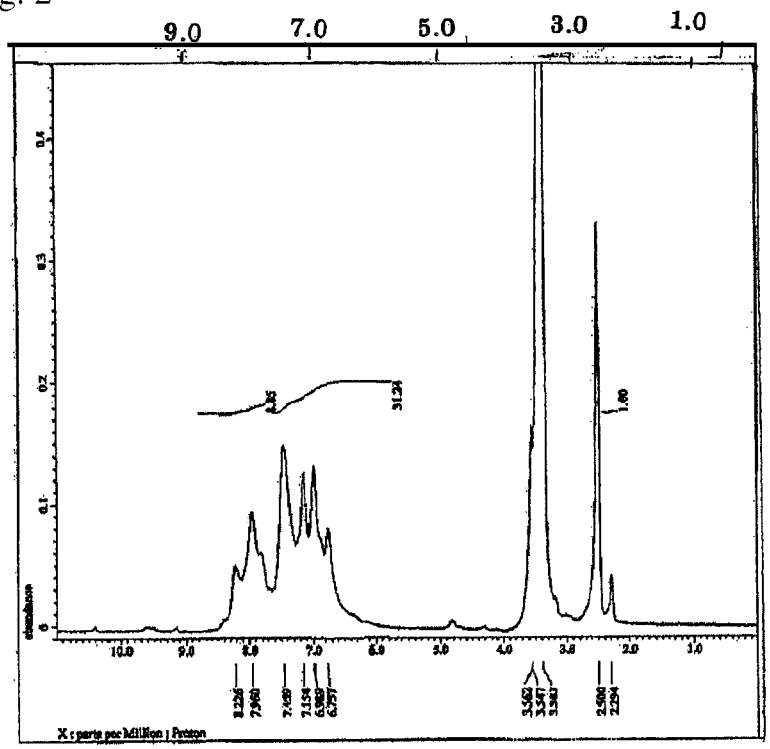
FIG. 2 shows the $^1$H-NMR spectrum of the polymer obtained in the synthesis example 2.

The weight-average molecular weight Mw of pNPNA-NA measured by GPC was 1,400 in terms of polystyrene, and polydispersity Mw/Mn was 1.62. The NMR spectrum of pNPNA-NA is shown in FIG. 2.

Synthesis Example 3

N-phenyl-1-naphthylamine (8.00 g, 0.036 mol, manufactured by Tokyo Chemical Industry Co., Ltd.), 9-anthracenecarboxyaldehyde (7.52 g, 0.036 mol, manufactured by Tokyo Chemical Industry Co., Ltd.), and para-toluenesulfonic acid monohydrate (0.727 g, 0.0036 mol, manufactured by Kanto Chemical Co., Inc.) were placed in a 100 mL four-neck flask, and then toluene (37.92 g, manufactured by Kanto Chemical Co., Inc.) was added thereto and stirred. The temperature was raised to 110° C. to dissolve the content so that polymerization is initiated. After 12 hours, the content was left to cool to 60° C. and re-precipitated in methanol (400 g, manufactured by Kanto Chemical Co., Inc.). The obtained precipitate was filtered and dried in a vacuum dryer at 50° C. for 10 hours, and then further dried at 120° C. for 24 hours to obtain 8.5 g of the target polymer (represented by Formula (3-15)), hereinafter, abbreviated as pNPNA-AA).

Figure 3:
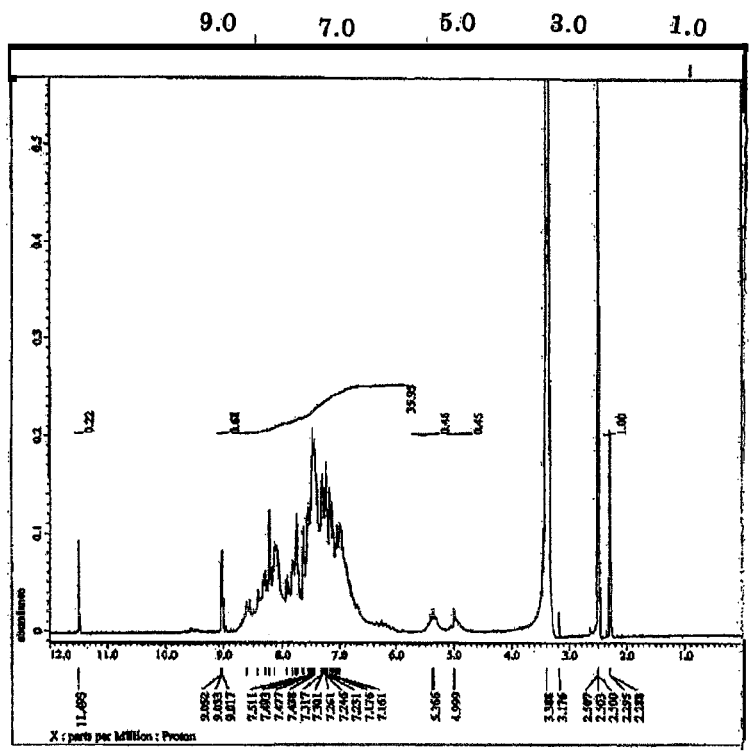
FIG. 3 shows the $^1$H-NMR spectrum of the polymer obtained in the synthesis example 3.

The weight-average molecular weight Mw of pNPNA-AA measured by GPC was 1,400 in terms of polystyrene, and polydispersity Mw/Mn was 1.63. The NMR spectrum of pNPNA-AA is shown in FIG. 3.

Synthesis Example 4

N-phenyl-1-naphthylamine (8.00 g, 0.036 mol, manufactured by Tokyo Chemical Industry Co., Ltd.), 1-pyrenecarboxyaldehyde (8.39 g, 0.036 mol, manufactured by Tokyo Chemical Industry Co., Ltd.), and para-toluenesulfonic acid monohydrate (0.727 g, 0.0036 mol, manufactured by Kanto Chemical Co., Inc.) were placed in a 100 mL four-neck flask, and then 1,4-dioxane (21.03 g, manufactured by Kanto Chemical Co., Inc.) was added thereto and stirred. The temperature was raised to 110° C. to dissolve the content so that polymerization is initiated. After 12 hours, the content was left to cool to a room temperature and re-precipitated in methanol (400 g, manufactured by Kanto Chemical Co., Inc.). The obtained precipitate was filtered and dried in a vacuum dryer at 50° C. for 10 hours, and then further dried at 120° C. for 24 hours to obtain 8.4 g of the target polymer (represented by Formula (3-16)), hereinafter, abbreviated as pNPNA-Py).

Figure 4:
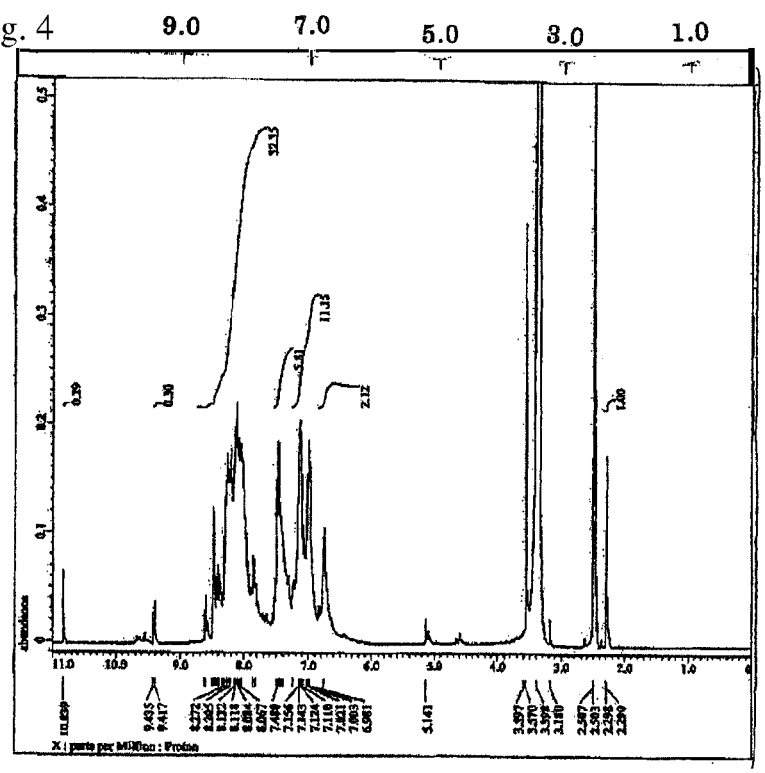
FIG. 4 shows the $^1$H-NMR spectrum of the polymer obtained in the synthesis example 4.

The weight-average molecular weight Mw of pNPNA-Py measured by GPC was 1,000 in terms of polystyrene, and polydispersity Mw/Mn was 1.62. The NMR spectrum of pNPNA-Py is shown in FIG. 4.

Synthesis Example 5

N-phenyl-1-naphthylamine (6.56 g, 0.030 mol, manufactured by Tokyo Chemical Industry Co., Ltd.), carbazole (5.00 g, 0.030 mol, manufactured by Tokyo Chemical Industry Co., Ltd.), 1-naphthaldehyde (9.35 g, 0.060 mol, manufactured by Tokyo Chemical Industry Co., Ltd.), and para-toluenesulfonic acid monohydrate (1.19 g, 0.0060 mol, manufactured by Kanto Chemical Co., Inc.) were placed in a 100 mL four-neck flask, and then 1,4-dioxane (51.57 g, manufactured by Kanto Chemical Co., Inc.) was added thereto and stirred. The temperature was raised to 110° C. to dissolve the content so that polymerization is initiated. After 12 hours, the content was left to cool to a room temperature and re-precipitated in methanol (400 g, manufactured by Kanto Chemical Co., Inc.). The obtained precipitate was filtered and dried in a vacuum dryer at 50° C. for 10 hours, and then further dried at 120° C. for 24 hours to obtain 8.4 g of the target polymer (represented by Formula (3-19)), hereinafter, abbreviated as pNPNA-Cz-NA).

The weight-average molecular weight Mw of pNPNA-Cz-NA measured by GPC was 1,400 in terms of polystyrene, and polydispersity Mw/Mn was 1.37.

Synthesis Example 6

N-phenyl-1-naphthylamine (6.56 g, 0.030 mol, manufactured by Tokyo Chemical Industry Co., Ltd.), carbazole (5.00 g, 0.030 mol, manufactured by Tokyo Chemical Industry Co., Ltd.), 1-naphthaldehyde (4.67 g, 0.030 mol, manufactured by Tokyo Chemical Industry Co., Ltd.), 4-methylbenzaldehyde (3.60 g, 0.030 mol, manufactured by Tokyo Chemical Industry Co., Ltd.), and para-toluenesulfonic acid monohydrate (1.19 g, 0.0060 mol, manufactured by Kanto Chemical Co., Inc.) were placed in a 100 mL four-neck flask, and then 1,4-dioxane (49.02 g, manufactured by Kanto Chemical Co., Inc.) was added thereto and stirred. The temperature was raised to 110° C. to dissolve the content so that polymerization is initiated. After 12 hours, the content was left to cool to a room temperature and re-precipitated in methanol (400 g, manufactured by Kanto Chemical Co., Inc.). The obtained precipitate was filtered and dried in a vacuum dryer at 50° C. for 10 hours, and then further dried at 120° C. for 24 hours to obtain 8.4 g of the target polymer (represented by Formula (3-21)), hereinafter, abbreviated as pNPNA-Cz-NA-MBA).

The weight-average molecular weight Mw of pNPNA-Cz-NA-MBA measured by GPC was 1,400 in terms of polystyrene, and polydispersity Mw/Mn was 1.37.

Synthesis Example 7

N-phenyl-1-naphthylamine (10.43 g, 0.048 mol, manufactured by Tokyo Chemical Industry Co., Ltd.), triphenylamine (5.00 g, 0.020 mol, manufactured by Tokyo Chemical Industry Co., Ltd.), 1-pyrenecarboxyaldehyde (15.63 g, 0.068 mol, manufactured by Tokyo Chemical Industry Co., Ltd.), and para-toluenesulfonic acid monohydrate (1.35 g, 0.0068 mol, manufactured by Kanto Chemical Co., Inc.) were placed in a 100 mL four-neck flask, and then 1,4-dioxane (75.62 g, manufactured by Kanto Chemical Co., Inc.) was added thereto and stirred. The temperature was raised to 110° C. to dissolve the content so that polymerization is initiated. After 12 hours, the content was left to cool to a room temperature and re-precipitated in methanol (400 g, manufactured by Kanto Chemical Co., Inc.). The obtained precipitate was filtered and dried in a vacuum dryer at 50° C. for 10 hours, and then further dried at 120° C. for 24 hours to obtain 8.4 g of the target polymer (represented by Formula (3-20)), hereinafter, abbreviated as pNPA-TPA-Py).

The weight-average molecular weight Mw of pNPNA-TPA-Py measured by GPC was 1,400 in terms of polystyrene, and polydispersity Mw/Mn was 1.39.

Example 1

20 g of the resin obtained in Synthesis Example 1 was mixed with 4.0 g of TMOM-BP (manufactured by Honshu Chemical Industry Co., Ltd., product name) as a cross-linker, 0.60 g of pyridinium para-toluenesulfonate as a catalyst, and 0.06 g of MEGAFAC R-30 (manufactured by Dainippon Ink and Chemicals, Incorporated, product name) as a surfactant, and the mixture was dissolved in 283.59 g of cyclohexanone to prepare a solution. Then, the solution was filtered through a polyethylene microfilter having the pore size of 0.10 μm and then filtered through a polyethylene microfilter having the pore size of 0.05 μm to prepare a solution of a resist underlayer film-forming composition used for a multilayer film lithography process.

Example 2

20 g of the resin obtained in Synthesis Example 2 was mixed with 4.0 g of TMOM-BP (manufactured by Honshu Chemical Industry Co., Ltd., product name) as a cross-linker, 0.60 g of pyridinium para-toluenesulfonate as a catalyst, and 0.06 g of MEGAFAC R-30 (manufactured by Dainippon Ink and Chemicals, Incorporated, product name) as a surfactant, and the mixture was dissolved in 283.59 g of cyclohexanone to prepare a solution. Then, the solution was filtered through a polyethylene microfilter having the pore size of 0.10 μm and then filtered through a polyethylene microfilter having the pore size of 0.05 μm to prepare a solution of a resist underlayer film-forming composition used for a multilayer film lithography process.

Example 3

20 g of the resin obtained in Synthesis Example 3 was mixed with 4.0 g of TMOM-BP (manufactured by Honshu Chemical Industry Co., Ltd., the product name) as a cross-linker, 0.60 g of pyridinium para-toluenesulfonate as a catalyst, and 0.06 g of MEGAFAC R-30 (manufactured by Dainippon Ink and Chemicals, Incorporated, product name) as a surfactant, and the mixture was dissolved in 283.59 g of cyclohexanone to prepare a solution. Then, the solution was filtered through a polyethylene microfilter having the pore size of 0.10 μm and then filtered through a polyethylene microfilter having the pore size of 0.05 μm to prepare a solution of a resist underlayer film-forming composition used for a multilayer film lithography process.

Example 4

20 g of the resin obtained in Synthesis Example 4 was mixed with 4.0 g of TMOM-BP (manufactured by Honshu Chemical Industry Co., Ltd., product name) as a cross-linker, 0.60 g of pyridinium para-toluenesulfonate as a catalyst, and 0.06 g of MEGAFAC R-30 (manufactured by Dainippon Ink and Chemicals, Incorporated, product name) as a surfactant, and the mixture was dissolved in 283.59 g of cyclohexanone to prepare a solution. Then, the solution was filtered through a polyethylene microfilter having the pore size of 0.10 μm and then filtered through a polyethylene microfilter having the pore size of 0.05 μm to prepare a solution of a resist underlayer film-forming composition used for a multilayer film lithography process.

Example 5

20 g of the resin obtained in Synthesis Example 5 was mixed with 4.0 g of TMOM-BP (manufactured by Honshu Chemical Industry Co., Ltd., product name) as a cross-linker, 0.60 g of pyridinium para-toluenesulfonate as a catalyst, and 0.06 g of MEGAFAC R-30 (manufactured by Dainippon Ink and Chemicals, Incorporated, product name) as a surfactant, and the mixture was dissolved in 283.59 g of cyclohexanone to prepare a solution. Then, the solution was filtered through a polyethylene microfilter having the pore size of 0.10 μm and then filtered through a polyethylene microfilter having the pore size of 0.05 μm to prepare a solution of a resist underlayer film-forming composition used for a multilayer film lithography process.

Example 6

20 g of the resin obtained in Synthesis Example 6 was mixed with 4.0 g of TMOM-BP (manufactured by Honshu Chemical Industry Co., Ltd., product name) as a cross-linker, 0.60 g of pyridinium para-toluenesulfonate as a catalyst, and 0.06 g of MEGAFAC R-30 (manufactured by Dainippon Ink and Chemicals, Incorporated, product name) as a surfactant, and the mixture was dissolved in 283.59 g of cyclohexanone to prepare a solution. Then, the solution was filtered through a polyethylene microfilter having the pore size of 0.10 μm and then filtered through a polyethylene microfilter having the pore size of 0.05 μm to prepare a solution of a resist underlayer film-forming composition used for a multilayer film lithography process.

Example 7

20 g of the resin obtained in Synthesis Example 7 was mixed with 4.0 g of TMOM-BP (manufactured by Honshu Chemical Industry Co., Ltd., product name) as a cross-linker, 0.60 g of pyridinium para-toluenesulfonate as a catalyst, and 0.06 g of MEGAFAC R-30 (manufactured by Dainippon Ink and Chemicals, Incorporated, product name) as a surfactant, and the mixture was dissolved in 283.59 g of cyclohexanone to prepare a solution. Then, the solution was filtered through a polyethylene microfilter having the pore size of 0.10 μm and then filtered through a polyethylene microfilter having the pore size of 0.05 μm to prepare a solution of a resist underlayer film-forming composition used for a multilayer film lithography process.

Comparative Example 1

20 g of a commercially available phenol novolac resin (a novolac resin obtained from phenol and formaldehyde, having the weight-average molecular weight Mw of 2,000) was mixed with 4.0 g of TMOM-BP (manufactured by Honshu Chemical Industry Co., Ltd., product name) as a cross-linker, 0.60 g of pyridinium para-toluenesulfonate as a catalyst, and 0.06 g of MEGAFAC R-30 (manufactured by Dainippon Ink and Chemicals, Incorporated, product name) as a surfactant, and the mixture was dissolved in 283.59 g of cyclohexanone to prepare a solution. Then, the solution was filtered through a polyethylene microfilter having the pore size of 0.10 μm and then filtered through a polyethylene microfilter having the pore size of 0.05 μm to prepare a solution of a resist underlayer film-forming composition used for a multilayer film lithography process.

(Measurement of Optical Parameter)

Each of the resist underlayer film solutions prepared in Examples 1 to 7 was applied onto a silicon wafer by using a spin coater. The solutions were subjected to baking on a hot plate at 240° C. for 1 minute, or at 400° C. for 2 minutes to form resist underlayer films (having a film thickness of 0.25 μm). For each of these resist underlayer films, a refractive index (the "n" value) and an optical extinction coefficient (the "k" value, also called an attenuation coefficient) at the wavelengths of 248 nm and 193 nm were measured by using a spectroscopic ellipsometer. Table 1 shows the results.

TABLE 1

| | | Refractive Index "n" and Optical Extinction Coefficient "k" | | | |
|---|---|---|---|---|---|
| | | n | k | n | k |
| | | (248 nm) | | (193 nm) | |
| Example 1 | Film Baked at 240° C. | 1.96 | 0.35 | 1.45 | 0.67 |
| | Film Baked at 400° C. | 1.71 | 0.47 | 1.46 | 0.55 |
| Example 2 | Film Baked at 240° C. | 2.07 | 0.39 | 1.33 | 0.47 |
| | Film Baked at 400° C. | 1.84 | 0.43 | 1.35 | 0.48 |
| Example 3 | Film Baked at 240° C. | 1.66 | 0.60 | 1.37 | 0.49 |
| | Film Baked at 400° C. | 1.64 | 0.57 | 1.41 | 0.49 |
| Example 4 | Film Baked at 240° C. | 1.86 | 0.64 | 1.46 | 0.64 |
| | Film Baked at 400° C. | 1.75 | 0.57 | 1.46 | 0.61 |

TABLE 1-continued

| | | Refractive Index "n" and Optical Extinction Coefficient "k" | | | |
|---|---|---|---|---|---|
| | | n | k | n | k |
| | | (248 nm) | | (193 nm) | |
| Example 5 | Film Baked at 240° C. | 1.69 | 0.57 | 1.37 | 0.48 |
| | Film Baked at 400° C. | 1.63 | 0.55 | 1.40 | 0.47 |
| Example 6 | Film Baked at 240° C. | 1.96 | 0.34 | 1.44 | 0.66 |
| | Film Baked at 400° C. | 1.72 | 0.47 | 1.46 | 0.55 |
| Example 7 | Film Baked at 240° C. | 1.85 | 0.62 | 1.48 | 0.63 |
| | Film Baked at 400° C. | 1.72 | 0.58 | 1.47 | 0.58 |

(Dissolution Test in Photoresist Solvent)

Each of the solutions of resist underlayer film-forming compositions prepared in Examples 1 to 7, and Comparative Example 1 was applied onto a silicon wafer by using a spin coater. The solutions were subjected to baking on a hot plate at 400° C. for 2 minutes to form resist underlayer films (having a film thickness of 0.25 μm). The resist underlayer film was immersed in a solvent used for resist, such as ethyl lactate, propylene glycol monomethyl ether, propylene glycol monomethyl ether acetate, and cyclohexanone, to confirm that the resist underlayer film was insoluble in the solvent.

(Measurement of Dry Etching Rate)

The etcher and etching gas used for measuring a dry etching rate are described below:

ES401 (manufactured by Nippon Scientific Co., Ltd.): $CF_4$

Each of the solutions of resist underlayer film-forming compositions prepared in Examples 1 to 7, and Comparative Example 1 was applied onto a silicon wafer by using a spin coater. The resist underlayer film was baked on a hot plate at 240° C. for 1 minute, or at 400° C. for 2 minutes to form a resist underlayer film (having a film thickness of 0.25 μm). The dry etching rate was measured by using the $CF_4$ gas as a etching gas.

The etching rate of the resin film (having a film thickness of 0.25 μm) obtained by applying a resist underlayer film-forming composition prepared in Comparative Example 1, followed by baking at 240° C. for 1 minute was set to 1.00. Comparison was made among the dry etching rates of resist underlayer films of Examples 1 to 7, and Comparative Example 1. Table 2 shows the results. The ratio of rate is the ratio calculated by (resist underlayer film)/(resin film of Comparative Example 1).

TABLE 2

| | Ratio of Dry Etching Rate | |
|---|---|---|
| | Ratio of Rate for Film Baked at 240° C. | Ratio of Rate for Film Baked at 400° C. |
| Example 1 | 0.64 | 0.76 |
| Example 2 | 0.74 | 0.73 |
| Example 3 | 0.70 | 0.73 |
| Example 4 | 0.74 | 0.67 |
| Example 5 | 0.72 | 0.90 |
| Example 6 | 0.73 | 0.95 |
| Example 7 | 0.70 | 0.70 |
| Comparative Example 1 | 1.00 | 1.15 |

<Evaluation of Optical Properties of Novolac Resin Thin Film>

A film thickness, and a refractive index at a wavelength of 550 nm or 633 nm were measured for each of novolac resin thin films obtained in Examples 1 to 7. Table 3 shows the results.

TABLE 3

Evaluation of Optical Properties of Novolac Resin

| Novolac Resin | | Refractive Index | | Film Thickness (nm) |
| --- | --- | --- | --- | --- |
| | | 550 nm | 633 nm | |
| Example 1 | pNPNA-BA | 1.73 | 1.71 | 51 |
| Example 2 | pNPNA-NA | 1.75 | 1.73 | 52 |
| Example 3 | pNPNA-AA | 1.79 | 1.76 | 51 |
| Example 4 | pNPNA-Py | 1.80 | 1.78 | 45 |
| Example 5 | pNPNA-Cz-NA | 1.76 | 1.73 | 54 |
| Example 6 | pNPNA-Cz-NA-MBA | 1.70 | 1.68 | 50 |
| Example 7 | pNPNA-TPA-Py | 1.79 | 1.76 | 42 |

As shown in Table 3, in phenylnaphthylamine novolac resins of the present invention, refractive indexes at the wavelength of 550 nm were 1.75 to 1.80, and refractive indexes at the wavelength of 633 nm were 1.68 to 1.78. The result indicates that the resins alone have very high refractive indexes.

INDUSTRIAL APPLICABILITY

As different from conventional high etch rate anti-reflective coatings, a resist underlayer film material of the present invention used for a multilayer film lithography process can provide a resist underlayer film having a selection ratio for a dry etching rate close to, or smaller than that of photoresist, or having a selection ratio for a dry etching rate smaller than that of a semiconductor substrate. Moreover, the resist underlayer film can also serve as an anti-reflective coating. It was also found that an underlayer film material of the present invention is also heat-resistant to form a hardmask thereon by vacuum evaporation.

A phenylnaphthylamine novolac resin of the present invention has excellent transparency within a visible range, excellent heat-resistance, and a high refractive index, and is highly soluble in various solvents. Thus, the phenylnaphthylamine novolac resin can be applied to various optical elements including a protective film for a liquid crystal display element, a TFT array flattening film, an overcoat for a color filter and the like, a spacer material, a light extraction improving film of an EL display, a light intake improving layer of an image sensor, and a light extraction improving layer of an LED element.

The invention claimed is:
1. A polymer comprising:
a unit structure (A) of Formula (1):

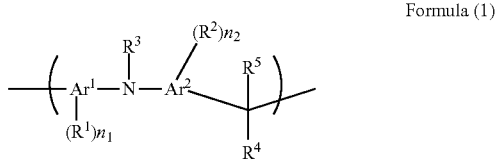

Formula (1)

where:
each of $Ar^1$ and $Ar^2$ is a benzene ring or a naphthalene ring,
each of $R^1$ and $R^2$ is a substituent of a hydrogen atom on the benzene ring or the naphthalene ring and is selected from the group consisting of a halogen group, a nitro group, an amino group, a hydroxy group, a $C_{1-10}$ alkyl group, a $C_{2-10}$ alkenyl group, a $C_{6-40}$ aryl group, and a combination of the halogen group, the nitro group, the amino group, the hydroxy group, the alkyl group, the alkenyl group, and the aryl group, in which each of the alkyl group, the alkenyl group, and the aryl group is an organic group that optionally contains an ether bond, a ketone bond, or an ester bond;
$R^3$ is selected from the group consisting of a hydrogen atom, a $C_{1-10}$ alkyl group, a $C_{2-10}$ alkenyl group, a $C_{6-40}$ aryl group, and a combination of the hydrogen atom, the alkyl group, the alkenyl group, and the aryl group, in which each of the alkyl group, the alkenyl group, and the aryl group is an organic group that optionally contains an ether bond, a ketone bond, or an ester bond;
$R^4$ is selected from the group consisting of a $C_{6-40}$ aryl group and a heterocyclic group, in which each of the aryl group and the heterocyclic group is an organic group that is optionally substituted with a halogen group, a nitro group, an amino group, a $C_{1-10}$ alkyl group, a $C_{1-10}$ alkoxy group, a $C_{6-40}$ aryl group, a formyl group, a carboxy group, or a hydroxy group;
$R^5$ is selected from the group consisting of a hydrogen atom, a $C_{1-10}$ alkyl group, a $C_{6-40}$ aryl group, and a heterocyclic group, in which each of the alkyl group, the aryl group, and the heterocyclic group is an organic group that is optionally substituted with a halogen group, a nitro group, an amino group, or a hydroxy group;
$R^4$ and $R^5$ together with a carbon atom to which $R^4$ and $R^5$ are bound optionally form a ring; and
each of $n_1$ and $n_2$ is independently an integer of 0 to 3;
wherein the unit structure (A) includes a unit structure (a1) where either $Ar^1$ or $Ar^2$ is a benzene ring, and the other is a naphthalene ring.

2. The polymer according to claim 1, wherein
$R^5$ in Formula (1) is a hydrogen atom, and
$R^4$ in Formula (1) is an optionally substituted phenyl group, an optionally substituted naphthyl group, an optionally substituted anthryl group, or an optionally substituted pyrenyl group.

3. The polymer according to claim 1, wherein
$R^3$ in Formula (1) is a hydrogen atom or a phenyl group.

4. The polymer according to claim 1, wherein
the unit structure (A) includes a unit structure (a2) where both $Ar^1$ and $Ar^2$ are benzene rings.

5. The polymer according to claim 1, wherein the polymer is a copolymer, comprising:
the first unit structure (a1) that has the formula of unit structure (A) where one of $Ar^1$ or $Ar^2$ is a benzene ring and the other one of $Ar^1$ or $Ar^2$ is a naphthalene ring; and
a second unit structure (a2) that has the formula of unit structure (A) where each of $Ar^1$ and $Ar^2$ is a benzene ring.

6. The polymer according to claim 1, wherein the polymer is a copolymer, comprising:
the unit structure (A) of Formula (1); and
a unit structure (B) of Formula (2):

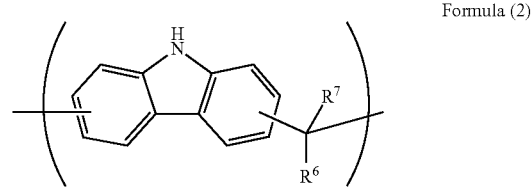

Formula (2)

where:
- $R^6$ is selected from the group consisting of a $C_{6-40}$ aryl group and a heterocyclic group, in which each of the aryl group and the heterocyclic group is an organic group that is optionally substituted with a halogen group, a nitro group, an amino group, a $C_{1-10}$ alkyl group, a $C_{1-10}$ alkoxy group, a $C_{6-40}$ aryl group, a formyl group, a carboxy group, or a hydroxy group;
- $R^7$ is selected from the group consisting of a hydrogen atom, a $C_{1-10}$ alkyl group, a $C_{6-40}$ aryl group, and a heterocyclic group, in which each of the alkyl group, the aryl group, and the heterocyclic group is an organic group that is optionally substituted with a halogen group, a nitro group, an amino group, or a hydroxy group; and
- $R^6$ and $R^7$ together with a carbon atom to which $R^6$ and $R^7$ are bound optionally form a ring.

7. The polymer according to claim 1, wherein the polymer is a copolymer, comprising:
the first unit structure (a1) that has the formula of unit structure (A) where one of $Ar^1$ or $Ar^2$ is a benzene ring and the other one of $Ar^1$ or $Ar^2$ is a naphthalene ring; and
a unit structure (B) of Formula (2):

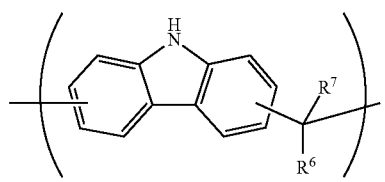

Formula (2)

wherein:
- $R^6$ is selected from the group consisting of a $C_{6-40}$ aryl group and a heterocyclic group, in which each of the aryl group and the heterocyclic group is an organic group that is optionally substituted with a halogen group, a nitro group, an amino group, a $C_{1-10}$ alkyl group, a $C_{1-10}$ alkoxy group, a $C_{6-40}$ aryl group, a formyl group, a carboxy group, or a hydroxy group;
- $R^7$ is selected from the group consisting of a hydrogen atom, a $C_{1-10}$ alkyl group, a $C_{6-40}$ aryl group, and a heterocyclic group, in which each of the alkyl group, the aryl group, and the heterocyclic group is an organic group that is optionally substituted with a halogen group, a nitro group, an amino group, or a hydroxy group; and
- $R^6$ and $R^7$ together with a carbon atom to which $R^6$ and $R^7$ are bound optionally form a ring.

8. A resist underlayer film-forming composition for lithography, comprising:
the polymer as claimed in claim 1.

9. The resist underlayer film-forming composition according to claim 8, further comprising:
a cross-linker.

10. The resist underlayer film-forming composition according to claim 8, further comprising:
an acid and/or an acid generator.

11. A resist underlayer film obtained by:
applying the resist underlayer film-forming composition as claimed in claim 8 onto a semiconductor substrate; and
baking the applied resist underlayer film-forming composition.

12. A method for manufacturing a semiconductor device, the method comprising:
forming an underlayer film on a semiconductor substrate with the resist underlayer film-forming composition as claimed in claim 8;
forming a resist film on the underlayer film;
forming a resist pattern by irradiation with light or an electron beam followed by development;
etching the underlayer film with the resist pattern; and
processing the semiconductor substrate with the patterned underlayer film.

13. A method for manufacturing a semiconductor device, the method comprising:
forming an underlayer film on a semiconductor substrate with the resist underlayer film-forming composition as claimed in claim 8;
forming a hardmask on the underlayer film;
forming a resist film on the hardmask;
forming a resist pattern by irradiation with light or an electron beam followed by development;
etching the hardmask with the resist pattern;
etching the underlayer film with the hardmask thus patterned; and
processing the semiconductor substrate with the underlayer film thus patterned.

* * * * *